United States Patent [19]
Ovshinsky et al.

[11] Patent Number: 5,335,219
[45] Date of Patent: Aug. 2, 1994

[54] HOMOGENEOUS COMPOSITION OF MICROCRYSTALLINE SEMICONDUCTOR MATERIAL, SEMICONDUCTOR DEVICES AND DIRECTLY OVERWRITABLE MEMORY ELEMENTS FABRICATED THEREFROM, AND ARRAYS FABRICATED FROM THE MEMORY ELEMENTS

[76] Inventors: Stanford R. Ovshinsky, 2700 Squirrel Rd., Bloomfield Hills, Mich. 48013; Stephen J. Hudgens, 2 Alexandria Towne, Southfield, Mich. 48075; David A. Strand, 2091 Daintree, West Bloomfield, Mich. 48323; Wolodymyr Czubatyj, 2426 Walter, Warren, Mich. 48092; Jesus Gonzalez-Hernandez, 5004 Mansfield, Apt. #101, Royal Oak, Mich. 48073; Hellmut Fritzsche, 5801 S. Blackstone, Chicago, Ill. 60637; Qiuyi Ye, 400 Hampton Cir., Apt. #201, Rochester, Mich. 48307; Sergey A. Kostylev, 1208 Lenox, Bloomfield Hills, Mich. 48304; Benjamin S. Chao, 3513 Sherwood Dr., Troy, Mich. 48083

[21] Appl. No.: 768,139

[22] Filed: Sep. 30, 1991

Related U.S. Application Data

[63] Continuation-in-part of Ser. No. 642,984, Jan. 18, 1991, Pat. No. 5,166,758.

[51] Int. Cl.$^5$ .............................................. G11C 13/00
[52] U.S. Cl. .................................... 369/288; 365/113
[58] Field of Search ............................ 369/288; 365/113

[56] References Cited

U.S. PATENT DOCUMENTS

| | | | |
|---|---|---|---|
| 3,530,441 | 9/1970 | Ovshinsky | 365/113 |
| 4,773,059 | 9/1988 | Mimemura et al. | 369/288 |
| 4,787,077 | 11/1988 | Barton et al. | 369/288 |
| 4,876,667 | 10/1989 | Ross et al. | 365/113 |
| 4,939,013 | 7/1990 | Kimura et al. | 369/288 |
| 5,063,097 | 11/1991 | Hirota et al. | 369/288 |

Primary Examiner—William D. Larkins
Attorney, Agent, or Firm—Marvin S. Siskind

[57] ABSTRACT

A unique class of microcrystalline semiconductor materials which can be modulated, within a crystalline phase, to assume any one of a large dynamic range of different Fermi level positions while maintaining a substantially constant band gap over the entire range, even after a modulating field has been removed. A solid state, directly overwritable, electronic and optical, nonvolatile, high density, low cost, low energy, high speed, readily manufacturable, multibit single cell memory based upon the novel switching characteristics provided by said unique class of semiconductor materials, which memory exhibits orders of magnitude higher switching speeds at remarkably reduced energy levels. The novel memory of the instant invention is in turn characterized, inter alia, by numerous stable and nonvolatile detectable configurations of local atomic order, which configurations can be selectively and repeatably accessed by input signals of varying levels.

29 Claims, 14 Drawing Sheets

| PHASE TYPE | BAND GAP (eV) | CONDUCTIVITY TYPE | REFLECTIVITY AT 830 nm |
|---|---|---|---|
| AMORP | 0.37 | INTRINSIN | 35% |
| FCC | 0.18 | INTRINSIC | 48% |
| HEX | 0.18-0.0 | P-TYPE | 48%-73% |

FIG - 7

HOMOGENEOUS COMPOSITION OF MICROCRYSTALLINE SEMICONDUCTOR MATERIAL, SEMICONDUCTOR DEVICES AND DIRECTLY OVERWRITABLE MEMORY ELEMENTS FABRICATED THEREFROM, AND ARRAYS FABRICATED FROM THE MEMORY ELEMENTS

RELATED APPLICATION INFORMATION

This application is a continuation-in-part of U.S. application Ser. No. 642,984, filed Jan. 18, 1991, now U.S. Pat. No. 5,166,758.

FIELD OF THE INVENTION

The present invention relates generally to a unique new class of homogeneous semiconductor materials characterized by a high concentration of modulatable free charge carriers. The mechanism of operation of devices fabricated from this new class of semiconductor materials is different from the operation of previous semiconductor devices and can be tailored to provide new device configurations exhibiting unusual new properties. More particularly, it relates to a new class of narrow band gap, microcrystalline semiconductor materials, per se; to these materials as specifically designed for solid state, electrically and optically operated, directly overwritable, extremely low energy, very fast switching, non-volatile, analogue and multilevel single-cell operating memory elements; and to high density electrical memory arrays fabricated from these materials.

BACKGROUND AND PRIOR ART

The operation of most semiconductor devices is governed by the control of mobile charge carrier concentrations different from that generated at thermal equilibrium.

Prior to the present invention, only four general methods were known by which to control and modulate the concentration of excess or free (these two terms are used interchangeably throughout this discussion) charge carriers in solid state semiconductor devices. These four known methods will be described hereinbelow following a general discussion of those fundamental mechanisms of operation of semiconductor devices which are necessary in order to appreciate the advantages of the instant invention.

By way of explanation, in a perfect semiconductor lattice with no impurities or lattice defects—an intrinsic semiconductor—no charge carriers are present at zero Kelvin since the valence band is filled with electrons and the conduction band is empty. At higher temperatures, however, electron-hole pairs generated as valence band electrons are excited thermally across the band gap to the conduction band. These thermally generated electron-hole pairs are the only charge carriers present in an intrinsic semiconductor material. Of course, since the electrons and holes are created in pairs, the conduction band electron concentration (electrons per cubic centimeter) is equal to the concentration of holes in the valence band (holes per cubic centimeter). It is well known, but worth emphasizing, that if a steady state carrier concentration is to be maintained, there must be recombination of the charge carriers at the same rate that they are generated. Recombination occurs when an electron in the conduction band makes a transition to an empty state (hole) in the valence band, either directly or indirectly through the agency of a mid-gap recombination center, thus annihilating the pair.

In addition to thermally generated charge carriers, it is possible to create carriers in semiconductor materials by purposely introducing certain impurities into the crystal lattice. This process is called doping and represents a common method of varying the conductivity of semiconductors. By doping, a semiconductor material can be altered so that it has a predominance of either electrons or holes, i.e., it is either n-type or p-type. When a crystal lattice is doped such that the equilibrium carrier concentrations are different from the intrinsic carrier concentrations, the semiconductor material is said to be "extrinsic". When impurities or lattice defects are introduced into an otherwise perfect lattice crystal, additional levels are created in the energy band structure, usually within the band gap. For instance, the introduction of phosphorous in silicon or germanium, generates an energy level very near the conduction band. This new energy level is filled with electrons at zero Kelvin, and very little thermal energy is required to excite these electrons to the conduction band. Thus, at about 50–100 Kelvin, virtually all of the electrons in the impurity level are donated to the conduction band. Semiconductor material doped with donor impurities can have a considerable concentration of electrons in the conduction band, even when the temperature is too low for the intrinsic charge carrier concentration to be appreciable.

Now that the reader can appreciate the significance of the presence of excess charge carriers for electrical conductivity, it must be noted that these carriers can also be created by optical excitation or they can be injected across a forward biased p-n junction or a Schottky barrier. Simply stated and regardless of the manner in which the excess carriers are generated, they can dominate the electrical conduction processes in a semiconductor material. It has previously been stated that there are four known methods of modulating the concentration of free charge. Those four methods are described below:

(1) In 1948, Bardeen, Brattain, and Schockley ushered in the modem era of semiconductor electronics when they demonstrated the operation of a solid state amplifier by successfully modulating the flow of injected minority charge carriers in bipolar junction transistors. The bipolar junction transistor is a three terminal device in which the flow of current through two terminals can be controlled by small changes in the current at the third terminal. This control feature provides for the amplification of small signals or for the switching of the device from an "on" state to an "off" state. In other words, the bipolar transistor is employed to modulate the injection and collection of minority charge carriers across a semiconductor junction. More particularly, and considering, for instance, in a p-n-p bipolar structure (the operation of an n-p-n bipolar structure is simply the reverse of the operation of the p-n-p structure), the negative side of the forward biased junction is the same as the negative side of the reverse biased junction. With this configuration, the injection of holes from the p-n junction into the center n region supplies the minority carriers, holes, to participate in the reverse flow of current through the n-p junction. As should now be evident, the designation of this device as "bipolar" relates to the critical importance of the action of both electrons and holes.

In operation, the reverse saturation current through the p-n junction of the device depends upon the rate at which minority carriers are generated in the neighborhood of the junction. It is possible to increase the reverse current through the junction by increasing the rate of electron-hole pair generation. This can be accomplished with light (as discussed below with respect to photodetectors). Electrically, a convenient hole injection device is a forward biased p-n junction in which the current is due primarily to holes injected from the p region into the n material. If the n side of the forward biased junction is the same as the n side of the reverse biased junction, the resultant p-n-p structure operates when the injection of holes from the p-n junction into the center n region supplies minority carder holes to participate in the reverse current flow through the n-p junction of the transistor. Of course, the n-region is narrowed so that the injected holes do not recombine in the n region (the base of this p-n-p bipolar transistor) before they can diffuse to the depletion layer of the reverse-biased junction.

Finally, when used as a switch, this type of transistor is usually controlled in two conduction states, referred to as the "on" state and the "off" state. While transistors do not function as a short circuit when turned on and as an open circuit when turned off, they are able to approximate these actions. In transistor switching, the emitter junction is forward biased and the collector is reverse biased, with a reasonable mount of current flowing out of the base. If the base current is switched to zero, the collector current will be negligible. This is the "off" state. However, if the base current is positive and sufficiently large, the device is driven to the saturation regime and the transistor is in its "on" state. Therefore, in the typical switching operation, the base current swings from positive to negative, thereby driving the device from saturation to cutoff and vice versa.

(2) The second conventional method of controlling the concentration of free charge carders is implemented by metal-oxide-semiconductor field effect transistor (MOSFET) devices. By way of background, one of the most widely employed electronic devices, particularly in digital integrated circuits, is the metal-insulator-semiconductor (MIS) transistor. In an MIS transistor, the concentration of charge carriers in the conduction channel is controlled by a voltage applied at a gate electrode isolated from the channel by an insulator. The resulting device may be referred to genetically as an insulated-gate field effect transistor (IGFET). However, since most IGFETs are made using a metal (typically aluminum) for the gate electrode, silicon-dioxide as the insulator, and silicon as the semiconductor material, the term MOS field effect transistor or MOSFET is commonly used.

In operation of a MOSFET, consider an n-type channel formed on a p-type silicon substrate. The n-type source and drain regions are formed by diffusing or implanting dopant atoms into a lightly doped p-type substrate. A thin oxide layer separates the metal gate from the silicon surface. No current flows from the drain to the source unless there is a conducting n-channel between them, since the drain-substrate-source combination includes oppositely directed p-n junctions disposed in series. When a positive voltage is applied to the gate relative to the substrate (the source in this example), positive charge carriers are deposited on the gate metal. As a result of this deposition, negative charge carriers are induced in the underlying silicon by the formation of a depletion region. In addition, a thin surface region containing mobile electrons is formed. The induced electrons form the channel of the FET and allow current to flow from the drain to the source. The effect of the gate voltage is to vary the conductance of the induced channel for low drain-to-source voltage. The MOS field effect transistor is particularly useful in digital circuits, in which it is switched from the "off" state (no conducting channel) to the "on" state. Both n-channel and p-channel MOS transistors are in very common usage.

The MOS structure can be thought of as a capacitor in which one plate is a semiconductor. If a negative voltage is applied between the metal and the semiconductor, a negative charge is effectively deposited on the metal. In response thereto, an equal net positive charge is accumulated at the surface of the semiconductor. In the case of a p-type substrate, this occurs by hole accumulation at the semiconductor-oxide interface. Since the applied negative voltage depresses the electrostatic potential of the metal relative to the semiconductor, the electron energies are raised in the metal relative to the semiconductor. The energy bands of the semiconductor bend near the interface to accommodate the accumulation of holes. Because no current passes through the MOS structure, there is no variation in the Fermi level position within the bulk of the semiconductor. The result is a bending of the semiconductor bands near the interface so that the Fermi level is closer to the valence band adjacent the interface, thereby indicating a larger hole concentration than that arising from the doping of the p-type semiconductor material.

When a positive voltage is applied from the metal to the semiconductor, the potential of the metal increases, thereby lowering the metal Fermi level relative to its equilibrium position. As a result, the oxide conduction band is again tilted. The positive voltage deposits positive charge on the metal and effectively calls for a corresponding net negative charge at the surface of the semiconductor. Such a negative charge in p-type material arises from depletion of holes from the region near the surface which leaves behind uncompensated ionized acceptors. In the depleted region, the hole concentration decreases, bending the bands down near the semiconductor surface. If the positive charge continues to increase, the bands at the semiconductor surface bend down still further. In fact, a sufficiently large voltage can cause a large electron concentration in the conduction band. The region near the semiconductor in this case has conduction properties typical of n-type material. This n-type surface layer is formed not by doping, but by "inversion" of what was originally p-type semiconductor material due to the applied voltage. This inverted layer, separated from the underlying p-type material by a depletion region, is the key to MOS transistor operation.

(3) The third known method of controlling the concentration of free charge carriers is by the photogeneration of free charge carriers of both polarities. This photogeneration of free charge carriers takes place in such state-of-the-art devices as photovoltaic cells, photoresistors, photodetectors and electrophotographic drums.

In general, when excess electrons or holes are created in a semiconductor material, there is a corresponding increase in the electrical conductivity of the material. In the event that the excess charge carriers are generated from optical excitation, the resulting increase in conductivity is called "photoconductivity". When photons are directed to impinge upon a semiconductor material, those photons having energies greater than the band gap energy are absorbed and electron hole pairs generated. The electron and hole created by this absorption process are excess carriers; since they are out of balance with their environment and exist in their respective bands, they contribute to the electrical conductivity of the material.

(4) The fourth known method of modulating the free charge carrier concentration in semiconductor materials is by controlling the physical structure of chalcogenide phase change materials as they undergo reversible amorphous to crystalline phase transformations. A detailed explanation of this phenomena was reported in the early work on optical and electrical Ovonic phase change materials pioneered by S. R. Ovshinsky at Energy Conversion Devices, Inc. These materials and technology are discussed in detail below.

Since the present invention has significant scientific applicability to and immediate commercial impact on many different segments of the electronic and semiconductor industries, said invention is discussed hereinbelow in three different, but related sub-sections. More particularly, the relevance of the instant invention is discussed with respect to: (A) semiconductor devices per se; (B) optically operable, fast, non-volatile phase change memories; and (C) electrically erasable, directly overwritable, multilevel single-cell memories.

A. Semiconductor Devices

The operation of bipolar transistors and MOSFETs is summarized in general terms in sections (1) and (2), above. From this discussion, it is easy for one skilled in the art to recognize that both of these electronic devices operate as three terminal structures in which the concentration of free charge carriers present in the semiconductor material of the device can be electrically modulated for as long as the external field or externally applied base current is applied; however, upon termination of the external electrical modulating signal, the modulation terminates and the semiconductor material from which the device is fabricated reverts back to the concentration of free charge which is exclusively determined by the pre-existing nature of the material as modified by dopant elements incorporated into the host matrix of the material. However, charge can be injected and stored on the gate, which charge remains after removal of the gate voltage. It is noteworthy that these devices require three terminals and, in order to operate, must be doped so as to form n-conductivity and p-conductivity regions and/or channels. In contrast thereto, devices fabricated from the materials of the instant invention require only two terminals and are made from a homogeneous body of semiconductor material.

B. Early Optical Phase Change Memory

Non-ablative, optical state changeable data storage systems record information in a state changeable material that is switchable between at least two detectable states through the input of an optical energy signal of a given time and amplitude.

State changeable data storage material is incorporated in a data storage device having a structure such that the data storage material is supported on a substrate and encapsulated. In the case of optical data storage devices, the encapsulations include, for example, anti-ablation materials and layers, thermal insulation materials and layers, anti-reflection materials and layers, reflective layers, and chemical isolation layers. Moreover, various layers may perform more than one of these functions. For example, anti-reflection layers may also be anti-ablation layers and thermal insulating layers. The thicknesses of the layers, including the layer adapted to minimize the amount of energy necessary for effecting a state change and optimize the high contrast ratio, are optimized to obtain high carrier to noise ratio and high stability of the state changeable data storage materials.

A "state changeable" material is a material that can be switched from one detectable state to another detectable state or states when radiation of a given energy is projected onto the material. State changeable materials are specifically tailored so that the detectable states differ in their morphology, surface topography, relative degree of order, relative degree of disorder, electrical properties, optical properties including indices of refraction and reflectivity, or combinations of one or more of these properties. The state of a state changeable material is detectable by the electrical conductivity, electrical resistivity, optical transmissivity, optical absorption, optical refraction, optical reflectivity, or a combination of these inherent properties. A common procedure employed in currently available write once and erasable so-called "phase change" optical memory materials utilizes structural changes in the material between crystalline and amorphous phases to alter the free carrier density of the material. The change in free carrier concentration results in changes in the refractive index of the material which gives rise to changes in optical reflectivity.

The methods of formation of data storage devices using optically addressable state changeable material includes deposition of the individual layers, for example by evaporative deposition, chemical vapor deposition, and/or plasma deposition. As used herein, plasma deposition includes sputtering, glow discharge, and plasma assisted chemical vapor deposition.

Tellurium based semiconductor materials have been utilized as state changeable materials for data storage where the state change is a structural change evidenced by a change in reflectivity. This effect is described, for example, by Feinleib, deNeufville, Moss, and Ovshinsky, in "Rapid Reversible Light-Induced Crystallization of Amorphous Semiconductors," 18(6) *Appl. Phys. Lett.* 254–257 (Mar. 15, 1971); and in U.S. Pat. No. 3,530,441 to Ovshinsky for METHOD AND APPARATUS FOR STORING AND RETRIEVING INFORMATION. A description of tellurium-germanium-tin semiconductor systems without oxygen is contained in the article by Chen, Rubin, Marello, Gerber, and Jipson, "Reversibility and Stability of Tellurium Alloys for Optical Data Storage," 46(8) *Appl. Phys. Lett.* 734–736 (Apr. 15, 1985). A description of tellurium-germanium-tin semiconductor systems with oxygen is contained in the article by Takenaga, Yamada, Ohara, Nishikiuchi, Nagashima, Kashibara, Nakamura, and Yamashita, "New Optical Erasable Medium Using Tellurium Suboxide Thin Film," *Proceedings, SPIE Conference on Optical Data Storage* 173–177 (1983).

Tellurium based state changeable semiconductor materials can be single or multi-phase systems. In these systems, the ordering phenomena include a nucleation and growth process (including homogeneous and/or heterogeneous nucleation) to convert a system of disordered materials to a system of ordered and disordered materials. Also in these systems, the vitrification phenomenon includes melting and rapid quenching of the phase changeable material to transform a system of disordered and ordered materials to a system of largely disordered materials. Such phase changes and separations occur over relatively small distances, with intimate interlocking of the phases .and gross structural discrimination and are highly sensitive to local variation in stoichiometry.

A serious limitation of the rate of data storage is the slow ordering or erasing time. One aspect of the slow ordering time is the sensitivity of the ordering time to variables such as the manufacturing history and the service history (the order-disorder cycle history). For example, in order to attain high ordering speeds, on the order of 0.1 to 10 microseconds, it is sometimes necessary to age the device or to introduce seed crystals and/or nucleation sites after deposition of the chalcogenide state change layer, prior to the deposition of the subsequent layer (barrier and encapsulation layers). Another aspect of this problem is that switching or ordering time can increase with increasing order-disorder cycles (this increase is identified by increasing order in the disordered material or portions of the disordered material).

A further aspect of this problem is the time required for the erase-rewrite cycle. A previous solution to this was a two laser erase-write cycle. With the first laser, an entire track, data segment, or data segment sector would be erased (crystallized). With the second laser, the entire track, data segment, or data segment sector would be written (by programmed vitrification).

More rapid data storage is described in U.S. Pat. No. 4,876,667 to Ross, Bjornard, and Strand, DATA STORAGE DEVICE HAVING A PHASE CHANGE MEMORY MEDIUM REVERSIBLE BY DIRECT OVERWRITE, filed Jun. 22, 1987. This patent describes a data storage device using a chalcogenide semiconductor material or mixture of chalcogenide materials as a data storage medium. These materials have crystallization times of under 1 microsecond (1000 nanoseconds), direct overwrite capability, and a long cycle life; are miscible solid solutions of a telluride and a selenide, such as arsenic telluride-arsenic selenide, antimony telluride-antimony selenide, or bismuth telluride-bismuth selenide; have a sufficiently low crystallization temperature and a sufficiently fast crystallization time to be easily switched from a less ordered detectable state to a more ordered detectable state with solid state lasers; and have a sufficiently high crystallization temperature to provide a measure of archival thermal stability. The '667 patent describes crystallization temperatures for these materials as greater than about 120° C. up to around 200° C.; the switching time, i.e. the erase or crystallization time, is described as less than 1 nanosecond and preferably less than 300 nanoseconds.

While the optically addressable phase change materials described above represented an improvement over earlier materials, these optical materials (i) are still relatively slow (microsecond switching is slow by present standards of electronic memory devices); (ii) require relatively high energy inputs to initiate a detectable change in local order, (iii) have only attained a cycle life in commercial production on the order of about 100,000 cycles; and (iv) have a relatively high cost per megabyte of stored information compared to hard disk storage.

Overcoming all of the foregoing deficiencies are objectives of the present invention.

The relatively slow switching speeds in known optically addressable phase change memories result from the fact that the memory media of the prior art have relied upon amorphous to crystalline phase transitions in order to obtain a large enough difference to be readily optically detectable in actual practice, that is phase transitions that provide for a reflectivity change of about 35%.

Since an amorphous-to-crystalline phase transition is necessary in order to produce this detectable difference, high energy inputs are required. It is these high energy inputs which are responsible for the relatively low cycle life of memory media of the prior art. While the chalcogenide material, which forms the active, light absorbing layer of the system, has no trouble absorbing the requisite amount of input energy, this energy has an adverse effect on the encapsulating layers of polymeric material which possess a different coefficient of thermal expansion vis-a-vis said chalcogenide material. It has been determined that cycling said memory media through tens of thousands of read-write cycles, creates stresses which eventually deform the polymer and prevent proper focusing of the input laser beam onto the discrete cells of the memory material.

Thus, an optically modulatable memory material that could switch between at least two detectable states that were closer together would yield much faster switching speeds, speeds in the nanosecond switching range. Further, this switching would require much lower energy, thereby avoiding deformation of the encapsulant and providing markedly improved cycle life.

C. Early Electrical Phase Change Memory

The general concept of utilizing electrically writable and erasable phase change materials (i.e., materials which can be electrically switched between generally amorphous and generally crystalline states) for electronic memory applications is well known in the art and as is disclosed, for example, in U.S. Pat. No. 3,271,591 to Ovshinsky, et at., issued Sep. 6, 1966 and in U.S. Pat. No. 3,530,441 to Ovshinsky, et al., issued Sep. 22, 1970, both assigned to the same assignee as the present invention, and both disclosures of which are incorporated herein by reference (hereinafter the "Ovshinsky patents").

As disclosed in the Ovshinsky patents, such phase change materials can be electrically switched between two different structural states of generally amorphous and generally crystalline local order or between different detectable states of local order across the entire spectrum between the completely amorphous and the completely crystalline states. That is, the Ovshinsky patents describe that the electrical switching of such materials is not required to take place between completely amorphous and completely crystalline states but rather can be in incremental steps reflecting changes of local order to provide a "gray scale" represented by a multiplicity of conditions of local order spanning the spectrum between the completely amorphous and the completely crystalline states. The early materials described by the Ovshinsky patents could also be switched between only two structural states of generally amorphous and generally crystalline local order to accommodate the storage and retrieval of binary encoded information.

The electrically erasable phase change memories described in the Ovshinsky patents were utilized in a number of commercially significant applications. Subsequent developments in other fields of solid state, electronic memories and in other types of memories in general, such as those utilizing magnetic and optical media eventually displaced these early electrically erasable phase change technology in the marketplace and prevented these phase change electrical memories from being used in, for instance, personal computers.

In a typical personal computer there often are four tiers of memory. Archival information is stored in inexpensive, slow, high storage capacity, non-volatile devices such as magnetic tape and floppy disks. This information is transferred, as needed, to faster and more expensive, but still non-volatile, hard disk memories. Information from the hard disks is transferred, in turn, to the still more expensive, faster, volatile system memory which uses semiconductor dynamic RAM (DRAM) devices. Very fast computers even transfer forth and back small portions of the information stored in DRAM to even faster and even more expensive volatile static RAM (SRAM) devices so that the microprocessor will not be slowed down in the computations by the time required to fetch data from the relatively slower DRAM. Transfer of information among the tiers of the memory hierarchy occupies some of the computer's power and this need for "overhead" reduces performance and results in additional complexity in the computer's architecture. The current use of the hierarchal structure, however, is dictated by the price and performance of available memory devices and the need to optimize computer performance while minimizing cost.

The electrically and optically erasable phase change memories described in the Ovshinsky patents had a number of limitations that prevented their widespread use as a direct and universal replacement for present computer memory applications, such as tape, optical, hard disk drive, solid state disk flash, DRAM, SRAM, and socket flash memory. Specifically, the following represent the most significant of these limitations: (i) relatively slow (by present standards) electrical switching speed, particularly when switched in the direction of greater local order (in the direction of increasing crystallization); (ii) relatively high energy inputs are necessary in order to initiate a detectable change in local order; and (iii) a relatively high cost per megabyte of stored information, particularly in comparison to hard disk storage.

The most significant of these limitations is the relatively high energy input required to obtain detectable changes in the chemical and/or electronic bonding configurations of the chalcogenide material in order to initiate a detectable change in local order. Also significant were the switching times of the electrical memory materials described in the Ovshinsky patents. These materials typically required times in the range of a few milliseconds for the set time (the time required to switch the material from the amorphous state to the crystalline state); and approximately a microsecond for the reset time (the time required to switch the material from the crystalline state back to the amorphous state). The electrical energy required to switch these materials typically measured in the range of about a microjoule.

It should be noted that this amount of energy must be delivered to each of the memory elements in the solid state matrix of rows and columns of memory cells. Such high energy levels translate into high current carrying requirements for the address lines and for the cell isolation/address device associated with each discrete memory element. Taking into consideration these energy requirements, the choices of memory cell isolation elements for one skilled in the art would be limited to very large single crystal diode or transistor isolation devices, which would make the use of micron scale lithography and hence a high packing density of memory elements impossible. Thus, the low bit densities of matrix arrays made from this material would result in a high cost per megabyte of stored information.

By effectively narrowing the distinction in price and performance between archival, non-volatile mass memory and fast, volatile system memory, the memory elements of the present invention have the capability of allowing for the creation of a novel, non-hierarchal "universal memory system". Essentially all of the memory in the system can be low cost, archival and fast. As compared to original Ovshinsky-type phase change electrical memories, the memory materials described herein provide over six orders of magnitude faster programming time (less than 10 nanoseconds) and use extraordinarily low programming energy (less than 50 picojoules) with demonstrated long term stability and cyclability (in excess of 20 million cycles). Also, experimental results indicate that additional reductions in element size can increase switching speeds and cycle life.

The concept of utilizing Ovshinsky-type electrical phase change materials in non-erasable or non-reversible, write-once electrically programmable memories is described, for example, in U.S. Pat. No. 4,499,557 of Holmberg, et at. issued Feb. 12, 1985 and U.S. Pat. No. 4,599,705 of Holmberg, et at. issued Jul. 8, 1986, both of which are assigned to the same assignee as the present invention and the disclosure of which are incorporated herein by reference. These patents describe having tetrahedral chemical bonds, such as carbon, silicon, and germanium and alloys thereof as phase change materials that are utilized in a non-reversible or non-resettable mode. Such materials are disclosed as having, for example, characteristics which require threshold setting voltages of up to 10 volts, currents up to 25 milliamps and setting times of up to 100 microseconds. Thus, the set power required is up to 250 milliwatts with corresponding set times of up to 100 microseconds. These high voltages, amperages and time periods are not surprising when considered in light of the findings described in the instant specification, The fact is that these early devices relied on amorphous-to-crystalline phase transitions and therefore required relatively high energy inputs in order to obtain detectible output signals.

In general, development and optimization of the general class of chalcogenide memory materials has not proceeded at the same rate as other types of solid state electrical memories that now have substantially faster switching times and substantially lower set and reset energies. These other forms of memories typically employ several solid state microelectronic circuit elements for each memory bit, as many as three or four transistors per bit, for example, in some memory applications. The primary nonvolatile memory elements in such solid state memories, such as EEPROM, are typically floating gate field effect transistor devices which have limited re-programmability and which hold a charge on the gate of a field effect transistor to store each memory bit. Since this charge can leak off with the passage of time, the storage of information is not truly non-volatile as it is in the phase change media of the prior art where information is stored through changes in the actual atomic configuration or electronic structure of the chalcogenide material from which the elements are fabricated. These other forms of memories now enjoy some limited acceptance in the marketplace.

In contrast to DRAM and SRAM volatile memory devices and unlike other non-volatile EEPROM devices, such as floating gate structures, no field effect transistor devices are required in the electrical memory devices of the present invention. In fact the electrically erasable, directly overwritable memory elements of the present invention represent the simplest possible electrical memory device to fabricate, comprising only two electrical contacts to a monolithic body of thin film chalcogenide material and a semiconductor diode for isolation. As a result, very little chip "real estate" is required to store a bit of information, thereby providing for a configuration of inherently high density memory chips. Further, and as described below, additional increases in information density can be accomplished in the memory elements of the present invention through the use of multibit storage in each discrete memory cell.

The solid state, electronic memories presently in use are relatively expensive to manufacture, the cost being typically about twice the cost per bit of storage capacity in relation to magnetic disk storage. On the other hand, these solid state, electronic memories provide certain advantages over magnetic disk memories in that they have no moving parts, require much less electrical energy to operate, are easy to transport and store, and are more versatile and adaptable for use with portable computers and other portable electronic devices. As a matter of fact, hard drive manufacturers are forecasting rapid growth in the use of ever smaller hard drives and eventually solid state memory storage in the portable computer field. In addition, these solid state memories are usually true random access systems as opposed to disk types which require physical movement of the disk head to the proper data track for accessing the desired memory location.

However, in spite of such advantages, the higher cost of solid state electrically erasable memories have prevented them from enjoying a substantial share of the market now dominated by magnetic disk type memory systems. Although solid state electrically erasable memories could potentially be manufactured at reduced cost, the overall performance parameters of these materials are inadequate for them to fully replace magnetic disk systems.

We previously mentioned that there were only four known types of semiconductor devices which could be employed to modulate the concentration of free charge. Each of those devices were then discussed in some detail. A fifth semiconductor device which can be set to a plurality of different resistance values by relatively low energy pulses and which is capable of relatively fast switching characteristics will now be discussed in detail. After carefully perusing the following paragraphs describing the performance characteristics and the physics behind the operation of the device, the reader will understand why it was not categorized as a fifth type of charge concentration modulating semiconductor device.

A recently developed memory device is the metal-amorphous silicon-metal (MSM) electrical memory switch. See Rose, et al, "Amorphous Silicon Analogue Memory Devices", *Journal of Non-Crystalline Solids*, 115(1989), pp. 168–70 and Hajto, et al, "Quantized Electron Transport in Amorphous Silicon Memory Structures", *Physical Review Letters*, Vol. 66, No. 14, Apr. 8, 1991, pp. 1918–21. This MSM switch is fabricated by the deposition of specifically selected metallic contacts on either side of a p-type amorphous silicon (a-Si) thin film. The importance of the selection of the metallic contact materials will be discussed later. MSM memory switches were disclosed in said publications as exhibiting relatively fast (10–1130 ns) analogue switching behavior for voltage pulses of from 1–5 volts, thereby providing a range of resistances of from about $10^3$ to about $10^6$ ohms to which they can be set in a nonvolatile manner. As should be readily apparent to skilled practitioners in the art, the MSM memory switches of Rose, et al and Hajto, et al, although exhibiting electrical switching characteristics (i.e.,times, energies and resultant device resistance) similar to the electrical switching characteristics of the memory elements of the instant invention, actually present significant operational differences.

The most significant electrical switching difference (relative to the switches of the instant invention) resides in the inability of the MSM memory switches to be directly overwritten. That is, the MSM switches cannot be modulated directly and bidirectionally from any one resistance in the analogue range of resistances to any other resistance in that range without first being erased (set to a specific starting resistance or "starting state"). More specifically, the MSM switch must first be set to the high resistance state (erased) before said switch can be set to another resistance value within the analogue range. In contrast thereto, the memory elements of the instant invention do not require erasure before being set to another resistance in the range; i.e., they are directly overwritable.

Another significant difference in the electrical switching characteristics which exists between the MSM memory switches of Rose, et al and Hajto, et al and the electrical memory elements of the present invention resides in the bipolar behavior of the said switches. As is disclosed by Rose, et at, the MSM switches must be erased using electrical pulses of reverse polarity from those pulses used to write. Significantly, this reversal of polarity of the applied pulse is not required by the memory elements of the present invention, whether the instant memory elements am used for digital or analogue switching.

These differences in electrical switching characteristics between the MSM switches and the memory elements of the present invention are attributable to more than just a mere difference in the material from which the elements are constructed. These differences are indicative of the fundamental differences in switching mechanisms which characterize the physics of operation of the two devices. As alluded to above and as disclosed in the aforementioned articles, the electrical switching characteristics of the MSM memory switches are critically dependent upon the particular metal(s) from which the contacts are fabricated. This is because these MSM switches require a very highly energetic "forming" process in which metal from at least one of the contacts is transported into and formed as an integral portion of the switch body. In this process, a plurality (at least 15 from FIG. 1 of the Rose, et al paper) of progressively increasing 300 nanosecond, 5–15 volt pulses are employed to form the switch. Rose, et al state: ". . . X-ray microanalysis studies of the devices have been carried out, and the top electrode material has been found embedded in a filamentary region of the a-Si. This suggests that the top metal becomes distributed in the filament, and may play a role in the mechanism of switching . . . " Rose, et al also specifically find that the dynamic range of the available resistances is determined by the metal from which the upper electrode contact is fabricated. As is stated by Rose, et al: ". . . it is found that its value is entirely (sic) dependent on the top contact, and completely independent of the bottom metallisation (sic), i.e. Cr top electrode devices are always digital and V top electrode devices are always analogue irrespective of the bottom electrode . . . "

It is within this metallic filamentary region where the electrical switching occurs; and without this mass migration of metal into the a-Si, there would be no switching, see the Hajto, et al paper. In complete contradistinction thereto, the memory elements of the present invention do not require migration of the contact material into the thin-film memory element to achieve high speed, low energy, analogue, direct overwrite, memory switching. As a matter of fact, in the fabrication of the memory elements of the instant invention, great care is taken to prevent the diffusion of metal from either of the electrodes into the active chalcogenide material. In one embodiment of the device described in the instant invention, the electrodes are each fabricated as bilayered structures in which, for instance, carbon forms a thin film barrier to prevent migration or diffusion of, for instance, molybdenum into the chalcogenide switching material.

From the foregoing analysis of Rose, et al and Hajto, et al, it should be clear that MSM memory switches do not, by any stretch of the imagination qualify as a modulator of free charge concentration. Rather, MSM memory switches simply rely upon the creation of a filamentary metallic pathway through the amorphous silicon material in order to obtain a range of resistivities in much the same way as a modulated switch is used to control the flow of electrical current. A percolation pathway is established, the diameter of which can be increased or decreased to change the resistivity thereof. The filamentary pathway cannot be homogeneous. No movement of Fermi level position is involved in the switching process. No change in the activation energy of the semiconductor material need be invoked to explain the operation. No atomic scale movement of lone pairs of non-bonding electrons is present. Crystallite size and surface to volume ratio thereof is not important. But most importantly, it is impossible for Rose, et al and Hajto, et al to directly overwrite information stored in the cells of their memory material. The MSM switch requires stored information to be erased before new information can be written. It is not surprising that Rose, et al have asserted that their MSM switch is limited to one million cycles while the memory elements of the instant invention were cycled over 20 million cycles without failure prior to ending the test.

Simply stated, no solid state memory system developed prior to the present invention, regardless of the materials from which it was fabricated, has been inexpensive; easily manufacturable; electrically writable and directly erasable (overwritable) using low input energies; capable of multibit storage in a single cell (possesses gray scale capabilities), non-volatile; and capable of very high packing density. It is submitted that the memory system described below, because it addresses all of the deficiencies of known memory systems, will find immediate widespread use as a universal replacement for virtually all types of computer memory currently in the marketplace. Further, because the memories of the present invention can be fabricated in an all thin-film format, three-dimensional arrays are possible for high speed, high density neural network, and artificial intelligence applications. The memory system of the present invention is therefore uniquely applicable to neural networks and artificial intelligence systems because its multi-layer, three-dimensional arrays provide massive amounts of information storage that is rapidly addressable thus permitting learning from stored information.

It is clear from the discussion above that the quantitative changes in switching speed and energy requirements of the memories of the present invention compared to the phase change memories of the prior art demonstrates that the memory materials of the present invention define an entirely new class of modulatable semiconductor material from which to fabricate devices such as memory materials. In addition, the prior an has no analog to the direct overwrite, wide dynamic range and multibit storage capabilities of the present invention. Further, the operation of the semiconductor materials of the present invention occurs solely in the crystalline state and is therefore vastly different from the operation of all prior art optical and electrical memory materials which have relied upon crystalline-to-amorphous phase transitions. Moreover, that difference in operation of devices fabricated from the semiconductor materials of the instant invention represents a direct and fundamental consequence of the manner in which not only the concentration of free charge can be modulated, but the fact that the new concentration of free charge to which the device has been modulated remains constant after that electric field has been removed. This feature represents a fifth and fundamentally new mechanism for modulating the concentration of free charge in semiconductor devices and makes possible a range of new and simple switching and amplification techniques with the capability of significant impact upon the semiconductor industry.

SUMMARY OF THE INVENTION

There is disclosed herein a new solid state, directly overwritable, electronic, non-volatile, high density, low cost, readily manufacturable, multilevel single cell memory utilizing a new class of homogeneous chalcogenide memory materials in unique configurations, which memory materials exhibit orders of magnitude higher switching speeds at remarkably reduced energy levels. The electrical performance characteristics of these new memory materials are so remarkable, although the materials are chalcogenide in nature, they vary so dramatically from prior art chalcogenide alloy phase change materials, that there can be little doubt but that the behavior of these memory materials could not have been previously predicted. The novel semiconductor and memory materials of the instant invention are characterized, inter alia, by numerous stable and non-volatile detectable configurations of local atomic order which can be selectively and repeatably established by electrical and/or optical input signals of varying pulse energy and duration. The semiconductor and memory devices of the instant invention are therefore switchable between atomic configurations of different local order in a single crystalline state so as to provide a wide dynamic range of gray scale settings. The orders of magnitude of improvement in switching speeds and in switching energies made possible by the memory elements and semiconductor devices disclosed herein is not merely incremental in nature, but rather represents a synergistic improvement beyond what was thought possible with prior art materials.

Another extremely important characteristic of the present class of chalcogenide electronic and optical memories and semiconductor materials is their ability to be set to low resistance values with electrical pulses of lower energy than the pulses required to set the materials at higher resistance values. This is in direct opposition to the behavior of the prior art chalcogenide electronic memory materials. The prior art materials required higher energy pulses to set at low resistance values and lower energy pulses to set at high resistance values. Therefore any chalcogenide electronic memory material which is capable of fast switching times, low switching energies, direct overwrite of stored information, gray scale dynamic range of resistances and requires lower energy pulses to set at low resistance values and higher energy pulses to set at higher resistance values is a member to this newly discovered family of Ovonic, high-speed, low-energy, direct-overwrite, gray-scale chalcogenide memory and/or semiconductor materials.

While theories are presently being intensively investigated, no theory which has been proposed to the present point in time which explains all of the extraordinary electrical switching behavior observed for the memory and/or semiconductor materials described herein. Specifically, the subject semiconductor materials can be switched between numerous electrically detectable conditions in nanosecond time periods with the input of picojoules of energy. The subject semiconductor materials are non-volatile and can be cycled (written and rewritten) almost indefinitely while maintaining the integrity of the information stored by the memory cell. The subject memory material is directly overwritable so that information stored in other memory elements need not be erased (as is required with ferroelectric storage systems) in order to change information stored in a given set of memory elements. Finally, the large dynamic range offered by the memory material of the subject invention provides for the gray scale storage of multilevels of binary information in a single memory cell.

As a first embodiment of the present invention, there is disclosed herein a directly overwritable, multilevel, single cell memory element comprising a volume of memory material. The memory material is characterized by a large dynamic range of electrically detectable values of resistance and the ability to be set at one of the plurality of said values within said dynamic range in response to a selected electrical input signal so as to provide such single cell with multilevel storage capabilities. There is also provided means for applying the input signal to set the memory material to a selected resistance value within the dynamic range. The input means consists of two spacedly disposed contacts which serve as terminals for reading from and writing to the memory element. The single cell of memory material is settable by said selected input signal to any resistance value in the dynamic range, regardless of the previous set value, and said material remains set at said value even after the signal has been terminated.

In a second embodiment of the instant invention, there is described an electrically operated memory array of directly overwritable, multilevel, single cell memory elements. The array includes a substrate and a plurality of electrically activated directly overwritable, multilevel, single cell memory elements spacedly disposed in a plurality of rows and columns on the substrate. Each of the memory elements has an isolation device associated therewith to electrically isolate the element from the remainder of the elements. Each of the single cell memory elements is defined by a volume of memory material. The memory material possesses an energy modulatable Fermi level position, said position characterized by the ability to be modulated over a large range of electrical resistances while maintaining a substantially constant optical band gap. The material is characterized by the ability to be set at one of a plurality of resistance values within the dynamic range in response to a selected electrical input signal so as to provide the cell with multilevel storage capabilities. Each of the memory elements further includes a pair of spacedly disposed contacts for applying an electrical input signal to set said memory material to a selected resistance value within the dynamic range. The contacts serve as terminals for reading from and writing to the memory element. The single cell of memory material is settable, by said selected electrical signal to any resistance value in said dynamic range, and said material is capable of remaining set at said value after the termination of the set signal. Address lines are provided so as to make electrical contact with the volume of memory material and with the isolation device, thereby providing means for selectively and individually setting and reading the resistance values of each discrete memory element.

In a third embodiment of the instant invention, there is a disclosed an optical memory disk formed of directly overwritable, multilevel, single cell memory elements. The disk includes a substrate and a large area body of memory material including a plurality of optically operated, directly overwritable, multilevel, single cell memory elements spacedly disposed on said substrate. Each of the single cell memory elements comprises a small area of said large area body of memory material. The memory material is characterized by a large dynamic range of optical reflectance values and the ability to be set at one of a plurality of reflectance values within the dynamic range in response to a selected optical input signal of selected energy so as to provide the memory cell with multilevel storage capabilities. The single cell of memory material is settable, by said selected input signal, to any reflectance value in said dynamic range, and said material is capable of remaining set at said value even after the set signal has been terminated. Address means are provided to selectively and individually set and read the reflectance values of each memory element thereupon.

In a fourth embodiment of the instant invention, there is provided a homogeneous microcrystalline chalcogenide alloy material having a modulatable Fermi level position and said material is characterized by the ability to be modulated to substantially different electrical conductivities while maintaining a substantially constant optical band gap. The material is also characterized by a range of stable, detectable electrical conductivities, and the Fermi level position of said material is capable of being modulated, by a selected input signal, to produce any desired one of the plurality of electrical conductivities within said range.

In a fifth preferred embodiment of the instant invention, there is disclosed a method of modulating a microcrystalline semiconductor material into any one of a plurality of stable detectable conditions. The material has modulatable Fermi level positions and is characterized by the ability to assume any one of a large dynamic range of substantially different electrical conductivities while maintaining a substantially constant optical band gap. The method includes the steps of providing a homogeneous body of chalcogenide alloy material and providing input energy in the range of about 1 to about 1,000 picojoules to modulate the electrical conductivity of said material to a specific value within the dynamic range.

In a sixth embodiment of the instant invention, there is disclosed a method of modulating the position of the Fermi level of a microcrystalline semiconductor material relative to a band edge thereof into any one of a plurality of metastable detectable positions. The material is characterized by a large dynamic range of substantially different electrical conductivities corresponding to the Fermi level position and a substantially constant optical band gap throughout the entire range. The method includes the steps of providing a homogeneous body of chalcogenide alloy material, applying an electrical signal to modulate the position of the Fermi level thereof to a selected position so as to obtain a given conductivity value within the dynamic range, and terminating the application of energy to the material while maintaining the position of the Fermi level thereof at substantially the selected position to which it was modulated.

In a seventh preferred embodiment of the instant invention, there is disclosed a method of modulating the electrical conductivity of a multi-element composition of microcrystalline semiconductor material, the constituent elements of which are intercoupled to form a lattice structure defining the crystallites of the material. The modulation is accomplished by varying the concentration of free charge contributed by the presence or absence of atoms of at least one of the constituent elements in the composition. The method includes the steps of providing a composition of microcrystalline semiconductor material which includes a volume fraction of crystallites, the crystallites defined by a lattice structure which incorporates atoms of each of the constituent elements in the composition; applying an electrical signal to the material so as to add or subtract charge carriers contributed by said one of the constituent elements in said composition into or out of the lattice structure, whereby the electrical conductivity of the material is modulated to a value which is dependent upon the concentration of free charge contributed by said at least one constituent element; and maintaining (a) the concentration of free charge determined by the application of energy, and (b) the new value of electrical conductivity of the material after terminating the application of the signal to said material.

In an eighth embodiment of the instant invention, there is described an optical memory disk of directly overwritable, single cell memory material comprising a substrate and a large area body of memory material capable of defining a plurality of optically operated, directly overwritable single-cell memory elements thereupon. Each of the single cell memory elements are defined by a small area portion of the large area body of memory material. The memory material is characterized by an optical energy modulatable lattice structure providing for two different optical reflectance values, and the ability to be set at any of said at least two different values in response to an optical input signal of selected energy. The single cell memory element is settable by the selected input signal to either of said reflectance values, regardless of the previous value of said material and address means are provided for the selective setting and reading of said reflectance values of each individual memory element. There is also provided a layer of encapsulating material extending over and hermetically sealing the large area body of memory material against environmental influences. The important feature of the semiconductor material of the instant invention, as it pertains to optical memory, is the ability thereof to be set, with stability, at any point in the dynamic range of reflectances even after the signal has been removed. Since the range of temperatures necessary to induce the change within one or more crystalline states is only about 250° to 450° C., the cycle life of the disk will be greatly extended as compared to conventional optical memory phase change materials which require a large amount of energy to cycle between the amorphous and crystalline states.

In a ninth embodiment of the instant invention, there is disclosed a narrow band gap, semiconductor material comprising a multi-element composition of semiconductor material, said material capable of stable electronic operation in at least two different crystalline states. Each of the crystalline states is characterized by a different lattice structure, different Fermi level positions, and substantially similar narrow energy band gaps of less than about 1.0 eV. A first one of the two stable lattice structures possesses a higher concentration of free charge than the second one of the lattice structure, whereby the second structure exhibits a significantly lower electrical conductivity than said first structure. The difference between the electrical conductivities of the first and second crystal lattice structures define the end points of a continuously varying range of electrical conductivities to which the semiconductor material can be set by energetic pulses and in which the material will remain after the pulse is terminated. The narrow band gap semiconductor material is microcrystalline with a crystallite size range of preferably less than about 2,000 Å, and more preferably, about 200 to about 400 Å. The additional concentration of free charge is generated by bonding vacancies in the lattice which occur when atoms of at least one of the constituent elements present in the second lattice structure are added or removed to transform the material to the first lattice structure.

In a tenth and final embodiment of the instant invention, there is disclosed a method of using narrow band gap chalcogenide materials, said materials being multi-element semiconductor compositions capable of stable electronic operation over a range of Fermi level positions in a given crystalline state without the presence of an external field. The method includes the steps of providing a homogeneous body of chalcogenide alloy material and modulating the material over said range of Fermi level positions, each Fermi level position characterized by substantially different electrical conductivities and substantially constant optical band gaps of less than about 1.0 eV; and a first one of the Fermi level positions identifiable by a higher concentration of free charge than a second one of the Fermi level positions.

Other embodiments and features of the present invention as well as other advantages and objects thereof will be set forth and become apparent from the detailed description of the invention which follows hereinafter, especially when taken in combination with the accompanying drawings.

BRIEF DESCRIPTION OF THE DRAWINGS

FIG. 7 is a tabular representation of data taken on the novel semiconductor material of the present invention comparing the electrical and optical properties for the amorphous and the different crystalline phases of said material;

DETAILED DESCRIPTION OF THE INVENTION

Figure 1:
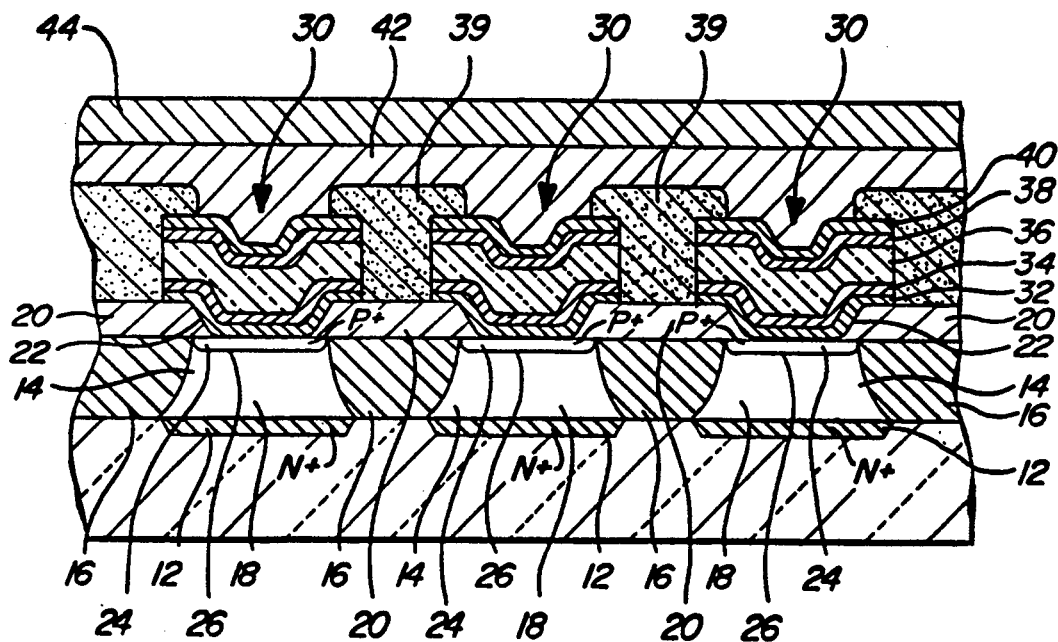
FIG. 1 is a fragmentary cross-sectional view illustrating a portion of an integrated circuit, said circuit depicting an electrically erasable and directly overwritable multilevel memory configuration of a first preferred embodiment of the present invention.

Erasable electrical memories fabricated from the broad class of chalcogenide materials have employed structural changes that were accommodated by movement of certain atomic species within the material to permit phase separation as the material switched from the amorphous state to the crystalline state. For example, in the case of electrically switchable chalcogenide alloys formed of tellurium and germanium, such as those comprising about 80% to 85% tellurium and about 15% germanium along with certain other elements in small quantities of about one to two percent each, such as sulfur and arsenic, the more ordered or crystalline state was typically characterized by the formation of a highly electrically conductive crystalline Te filament within the switchable pore of the memory material. Because Te is so highly conductive in its crystalline state, a very low resistance condition was established through the Te filament in the more ordered or crystalline state; this resistance being a number of orders of magnitude lower than the resistance of the pore in the less ordered or amorphous state.

However, the formation of the conductive Te filament in the crystalline state required migration of the Te atoms from their atomic configuration in the amorphous state to the new locally concentrated atomic configuration in the crystalline Te filament state. Similarly, when the chalcogenide filamentary material was switched back to the amorphous state, the Te which had precipitated out into the crystalline filament was required to migrate within the material from its locally concentrated form in the filament back to its atomic configuration in the amorphous state. This atomic migration, diffusion or rearrangement between the amorphous and crystalline states required in each case a holding or dwell time of sufficient length to accommodate the migration, thereby making the requisite switching time and energy relatively high.

The subject inventors have now discovered certain new principles which permit a remarkable reduction in both the required switching time and the energy input for an improved and fundamentally different type of electrically and/or optically erasable, directly overwritable memory primarily based on a new class of chalcogenide semiconductor materials. Moreover, the phenomenologically distinct chalcogenide materials of the instant invention are based on fundamentally new physics, the operation of which, although not fully understood, provides for switching either within a wide dynamic range of metastable states within a given crystalline lattice structure or between different crystalline states with remarkably low energy inputs at remarkably fast speeds. The result is that this newly discovered class of semiconductor materials can be used not only to fabricate improved optical and electrical memory elements, but also to fabricate new semiconductor devices. In operation, these novel materials are based upon the ability to create a very high, non-volatile and modulatable concentration of free charge in a homogeneous body of microcrystalline semiconductor material.

Although specific examples of semiconductor materials adapted for, inter alia, memory usage are described below, the memory element of the present invention can be fabricated from any homogeneous body of semiconductor material which meets the requirements set forth above of modulatable free charge concentration by shifting the Fermi level position relative to a band edge. Particularly, for the newly discovered family of semiconductor materials as applied to electrical and optical memories, the result is high-speed, low-energy, direct-overwrite, gray-scale operation. Preferably, the body of semiconductor memory material is homogeneous and formed of a chalcogenide material selected from the group of Te, Se, Ge, Sb, Bi, Pb, Sn, As, S, Si, P, O and mixtures or alloys thereof.

Again, no theory has been proposed to date which explains all of the extraordinary electrical switching behavior observed for the semiconductor memory material of the present invention. Specifically, the memory material of the present invention can be switched between numerous electrically or optically detectable conditions of varying resistance or reflectance in nanosecond time periods (the minimum switching speed and minimum energy requirements have not as yet been ascertained, however, experimental data as of the filing of this application have shown that the electrical memory of the instant invention can be modulated with 1 nanosecond programming pulses) with the input of picojoules of energy. This memory material is non-volatile and will maintain the integrity of the information stored by the memory cell (within a selected margin of error) without the need for periodic refresh signals. In contrast to many other semiconductor materials and systems heretofore specified for memory applications, the semiconductor memory material and systems of the present invention are directly overwritable so that the discrete memory elements need not be erased (set to a specified starting point) in order to change information stored there. Finally, the large dynamic range offered by the memory material of the present invention provides for the "gray scale" storage of information in a single cell. By storing information in analog form one can, in effect, store multiple bits of binary encoded information as a selected resistance value in a single memory cell. Experimental evidence gathered up to the point of filing the instant specification indicates that the remarkably fast and low energy switching to any of the wide dynamic range of the stable intermediate states of different values of resistance/reflectance can be attributed to the fact that said switching occurs without the need for gross atomic rearrangement of the switching material. Our current understanding suggests that the memory ahoy material is present in a microcrystalline phase and experimental evidence also demonstrates the existence of some correspondence between crystallite size of the microcrystalline semiconductor material described herein and the ability of that material to quickly assume stable intermediate states upon the application of a low energy signal.

As used herein, the term "non-volatile" will refer to the electrical memory of the present invention in which the set resistance value can be held constant for archival time periods without losing the integrity of information stored therein. Of course, software (including the feedback system discussed hereinafter) can be employed in conjunction with the memory elements of the present invention to insure that no "drift" occurs outside of the selected margin of error which would impede gray scale storage of information and/or cause loss of stored information.

As is well known to those skilled in the art, chalcogenide semiconductor materials, like other semiconductors, are characterized by a forbidden energy zone or band gap separating their conduction and valence bands (see the "Cohen, Fritzsche, Ovshinsky model" describing the mobility gap of chalcogenide semiconductor materials). The Fermi level position, i.e., the energy at which the probability of occupancy of an energy level is 50% determines, in part, the electrical conductivity of the semiconductor and, as it is moved to substantially different positions in the band gap, it can give rise to a large dynamic range of electrical conductivities. However, previously hypothesized theories can neither explain the very low energy requirements needed to change the position of the Fermi level and thereby set the memory elements at a given resistance value nor can they explain the types of results presented graphically below, particularly the remarkable ability to move to intermediate values of resistance in both directions (from values of lesser resistance to values of greater resistance upon the input of a given electrical/optical signal as well as visa versa) without returning to the aforementioned initial "starting state" which requires operation only in a single direction of movement (from values of higher resistance to values of lower resistance). The semiconductor material of the instant invention is directly overwritable. Regardless of the explanation of the manner in which this is accomplished, the present invention involves a completely novel class of semiconductor devices providing a combination of valuable electrical/optical switching characteristics never before available in a single memory element. It must be pointed out that experimental results have demonstrated that the chalcogenide compositions, investigated to date, employ hole conduction and when used for multilevel data storage operation, input signals can move the Fermi level position from a position in midgap to the valence band edge and even to a point deeper into the valence band.

A fundamental rule distinguishing noncrystalline solids from their crystalline counterparts is that the constituent atoms of the non-crystalline phases have 5 bonding options. This is the sine qua non of noncrystalline solids. It results from the fact that crystalline symmetry prescribes the lattice which, in turn, restricts chemical bonding choices. All of the properties possessed by an amorphous solid; its cohesive energy, its resistance to crystallization, its optical band gap, its mobility gap, its density of electronic states, etc., depend upon three factors; its short range bonding relationships, its varied topological configurations, and its total interactive environment. An amorphous material, however, can be a nonstoichiometric alloy in a nonequillibrium configuration, consisting of many different types of atoms, providing a variety of local order and environments. The crystallites from which a large volume fraction of the semiconductor material of the instant invention is composed, are very small, on the order of (by way of example) 500 Angstroms in major dimension. These crystallites are surrounded by a skin or surface region of structurally disordered material which may only be a few atomic monolayers thick. Therefore, an amorphous model or at least a model characterized by only short range local order, can best be employed to attempt to predict the molecular and atomic interactions in the surface region. Without wishing to be bound thereby, such a descriptive model will be described in the following paragraphs.

Since the specific semiconductor alloys employed in fabricating the memory devices contain chalcogenide elements and compounds/alloys of the chalcogenides are particularly noted for the presence of "lone pair" electrons, it is necessary to discuss the effect and nature of those lone pair electrons in available chemical bonding configurations. Simply stated, a lone pair is a pair of electrons in the valence shell of an atom that is not engaged in bonding. Such lone pair electrons are important both structurally and chemically. They influence the shape of molecules and crystalline lattice structures by exerting strong repulsive forces on neighboring electron pairs which are engaged in bonding configurations and as well as on other lone pairs. Since lone pair electrons are not tied down into a bonding region by a second nucleus, they are able to influence and contribute to low energy electronic transitions. It should be clear to the reader at this point of the instant specification that the mechanism described herein must indeed involve a low energy transition.

Specifically, the tellurium alloys described herein have a valence band made up of lone pair states. Since four (4) p shell electrons are present in Te, and the Te atom is chemically bonded by two of these bonding electrons in the p shell, the other two outer electrons (the lone pair) are not utilized for bonding purposes and hence do not substantially change the atomic energy of the system. In this regard, note that the highest filled molecular orbital is the orbital which contains the lone pair electrons. This is significant because, in a perfect stoichiometric crystal of tellurium and germanium atoms, upon the application of some internal strain in the lattice from which the crystallite is formed, the valence band can broaden and move upward toward the position of the then existing Fermi level. However, TeGe crystals are naturally "self-compensated", that is, the crystal desires to preferentially assume a Te rich (52 percent Te and 48 percent Ge) composition. The stoichiometric crystal is a face centered cube; however, with the addition of a minimal amount of additional energy, the crystal can assume a rhombohedral lattice structure by increasing the number of its Ge and/or Sb vacancies. It is this creation of vacancies in the crystalline lattice structure, which reduces lattice strain in TeGe alloys, lowers the energy state of the material and moves the Fermi level toward the valence band.

Although we have only demonstrated the existence of stable intermediates values of resistance in the rhombohedral crystal structure, one must remember that the system being discussed is microcrystalline in which the grain size is very small and the surface skin may play a very significant role. It is therefore acceptable, if not essential, to superimpose an amorphous model of local order on top of a short range local order model for the purpose of obtaining a descriptive explanation of atomic behavior. When considering the amorphous nature of the material, note that the density of defect states is greatest and the depth of the recombination centers for captured charge carriers the deepest, as one approaches the band tails (adjacent the band edges). The presence of these deep tail steps would provide a possible explanation for intermediate stable resistance values between the Fermi level position and the band edge. Regardless of theory, the semiconductor material of the instant invention is a semiconductor which exhibits metallic-like conduction.

In our previous and co-pending applications, we discussed the composition, $Te_{51}Ge_{40}Sb_9$, which was said to form a single crystalline phase of substantially the same composition as the elements in the amorphous state. Thus, the material was described as having substantially the same composition in the amorphous state and in the single crystalline phase formed when the material is electrically switched. This material was said to have its electronic band gap collapse in its transition from the amorphous state to the crystalline state such that, in the crystalline state, it is no longer a semiconductor but rather is a metal or a semi-metal. That is, its band gap was thought to collapse and the conduction and valence bands to overlap in the crystalline state, thereby providing very high electrical conductivity which exhibits the weak temperature characteristics of an essentially metallic form of electrical conduction. However, while the experimental results were accurate, this theoretical description was not. This theory was proven to be inaccurate by an analysis done by optical microscopy which demonstrated that the material could not be a semi-metal due to its optical transmission properties. Optical transmission data has shown, instead, that the material is a narrow band gap semiconductor, which, in some instances is degenerate, therefore showing only weak temperature dependance of electrical conductivity.

The term "amorphous" as used herein refers to a condition which is relatively structurally less ordered or more disordered than a single crystal and as a result has at least one detectably different electrical characteristic, such as a lower electrical conductivity. The term "crystalline" as used herein refers to one or more conditions of structural order relative to the amorphous phase that have as a result detectably different electrical characteristics, such as a higher electrical conductivities.

It is further believed that the size of the crystallites which exist in the bulk of the semiconductor and memory material of the present invention is relatively small, preferably less than about 2000 Å, more preferably between about 50 and 500 Å, and most preferably on the order of about 200 to about 400 Å. Further, these crystallites are believed to be surrounded by an amorphous skin which may contribute to the rapid formation of the many Fermi level positions of the material, detectable as different resistances (conductivities)/reflectances, as well as to the lower energy requirements for the transitions between these detectable resistance/reflectance values to which the material can be reliably and repeatably set.

In accordance with still another aspect of the present invention, it has been found that modulation of the switching characteristics of two terminal devices fabricated from the microcrystalline materials of the present invention may be controlled such that repeatable and detectable switching resistance values can be effected. It has been found that, in order for the materials of the present invention to be quickly set by low energy input signals to a desired conductivity (determined by the Fermi level position selected) within the dynamic range, it is only necessary that said materials are capable of stable (or long lived metastable) existence with a plurality of different Fermi level positions, which Fermi level positions are characterized by substantially constant optical band gaps but different electrical conductivities. When characterized by these properties, the devices incorporating said material can be modulated so as to exhibit a desired degree of amplification and/or switching performance.

As noted above, it is also believed that the relatively small crystallite size may contribute to the rapid transition between detectable values of resistance/reflectance. It has now been postulated that a microcrystalline lattice structure switches more rapidly between these resistance values because the microstructures can be readily adjusted on the atomic level. For instance, if it is the lone pair electrons which are responsible for the rapid switching, bonds with the Ge or Sb atoms do not even have to be broken by the electrical/optical pulse in order to provide for increased electrical conductivity.

One characteristic of the semiconductor materials of the present invention is their tendency toward the formation of more and smaller crystallites per unit volume of the material. Crystallite sizes of the widest preferential range of representative materials embodying the present invention have been found to be far less than the range of about 2,000 to 5,000 Å which was characteristic of prior art materials. Crystallite size is defined herein as the diameter of the crystallites, or their "characteristic dimension" which is equivalent to the diameter where the crystallites are not spherically shaped.

It has been determined that compositions in the highly resistive state of the class of TeGeSb materials which meet the criteria of the present invention are generally characterized by substantially reduced concentrations of Te relative to that present in prior art electrically erasable memory materials. In one composition of this class that provide the substantially improved electrical and optical switching performance characteristics, the average concentration of Te in the as deposited materials was well below 70%, typically below about 60% and ranged in general from as low as about 23% up to about 58% Te and most preferably about 48% to 58% Te. Concentrations of Ge were above about 5% and ranged from a low of about 8% to about 40% average in the material, remaining generally below 50% Ge, with the remainder of the principal constituent elements in this composition being Sb. The percentages given are atomic percentages which total 100% of the atoms of the constituent elements. Thus, this composition may be characterized as $Te_aGe_bSb_{100-(a+b)}$, where a is equal to or less than about 70% and preferably between about 48% to about 58%, b is above about 5% and less than 50%, preferably between about 8% to about 40% and the remainder is Sb.

In the case of the TeGeSb composition, the following crystalline phases, shown in table 1, were found to be present either singly or in combination in various forms of the low resistance state:

TABLE I

| Observed Crystalline Phases of TeGeSb | | | |
|---|---|---|---|
| Name of Phase | At % Te | At % Ge | At % Sb |
| α | 51 | 44 | 5 |
| β | 51 | 40 | 9 |
| γ | 45 | 28 | 27 |
| δ | 23 | 19 | 58 |
| η | 56 | 17 | 27 |
| κ | 53 | 30 | 17 |

The average composition for these elements was in one sample about 53% Te, 21% Ge and 26% Sb.

With respect to electrical memory applications, the invention is set forth hereinafter with crystalline semiconductor diode devices as the preferred isolation element for affecting the read and write addressing of each discrete memory cell. However, any other device which is capable of electrically isolating each memory element from the remainder of the elements at the required voltages and which has a small footprint (and hence high packing density) is equally useable in place of the crystalline diodes. Other such isolation devices are thin film microcrystalline or polycrystalline semiconductor diodes, single crystal semiconductor diodes, Ovonic threshold switches and single crystal or thin film transistors. In those instances in which diodes are employed to isolate a large matrix of memory elements, it has been calculated that a front to back rectification of at least four orders of magnitude must be present.

Referring now to FIG. 1, there is shown a cross-sectional view of a portion of the structure of an electrically erasable memory of the present invention. The memory structure is formed on a single crystal silicon semiconductor wafer 10 which is p-doped and which forms a p-substrate for the deposition of the remaining elements of the configuration illustrated.

Formed in the p-substrate 10 are n+ channels 12, which may be formed by diffusion in a manner well known in the art. These n+ channels extend across the chip in a direction perpendicular to the plane of the illustration and form one set of electrodes, in this case the y set, of an x-y electrode grid for addressing the individual memory elements. On top of this n+ grid structure is formed an n-doped crystalline epitaxial layer 14, again by techniques well known in the art. The n doped epitaxial layer 14 may be about 5,000 Å thick, for example. Using known masking and doping techniques, p-doped isolation channels 16 are then formed in the n-epitaxial layer 14. These p-doped isolation channels 16 extend all the way down to the p substrate 10 as shown in FIG. 1 and also extend completely around and isolate and define islands 18 of the n-epitaxial layer 14. The islands 18 are shown more clearly in the top view of FIG. 2 wherein the p isolation channels are shown as forming an isolation grid defining and isolating the islands 18 of n epitaxial material. Instead of the p-doped isolation channels, SiO2 isolation trenches may be used for isolation of the islands 18. The technique of formation of such SiO2 isolation trenches is well known to those skilled in the art.

A layer 20 of thermally grown SiO2 is then formed on the structure just described and etched out to form apertures 22 over the islands 18. Diffusion regions 24 of p+ material are then formed within the areas defined by the apertures 22 as shown in FIG. 1. The semiconductor junctions of the p+regions and the n epitaxial layer form p-n junction diodes 26 in series with each of the regions of the n epitaxial layer exposed through the apertures 22 of the SiO2 layer 20. The memory elements 30 are then deposited over the p+ regions 24 in individual ohmic electrical series contact with the diodes 26. The memory elements 30 are comprised of bottom thin electrical contact layers of molybdenum 32 and carbon 34, the memory layer 36 formed of a material as described above, and upper thin electrical contact layers 38 of carbon and 40 of molybdenum. The contact layers 32, 34, 38 and 40 of carbon and molybdenum form excellent electrical contacts with the memory layers 36 and also form diffusion barriers which effectively block diffusion of the ohmic metal contact, carbon, into and out of the layers of chalcogenide memory material 36. This, of course, is in marked distinction to the work of Rose, et al with amorphous silicon memory structures wherein the metallic contact is purposely and necessarily diffused into the filamentary conduction paths in order to obtain the differences in conductivity.

The carbon layers 34 and 38 have a relatively high electrical resistivity and are more difficult to etch and are therefore preferably relatively thin, typically in the range of 100 to 1,000 Å or so. The molybdenum layers 32 and 40 should be thicker, in the range of 1,000 to 2,000 Å or so in order to act as effective barriers preventing the diffusion of carbon into the layer of memory material 36.

The layer of memory material 36 is homogeneous and formed of a multi-element semiconductor material, such as the chalcogenide materials disclosed herein. The layer 36 may be deposited by methods such as sputtering, evaporation or by chemical vapor deposition (CVD), which may be enhanced by plasma techniques such as RF glow discharge. The chalcogenide memory materials of the instant invention are most preferably made by RF sputtering and evaporation. Typical deposition parameters for RF sputtering and evaporation of the chalcogenide layer 36 are set forth below in Tables 2 and 3, respectively.

TABLE 2

| RF Sputtering Deposition Parameters | |
| --- | --- |
| Parameter | Typical Range |
| Base pressure | $8 \times 10^{-7} - 1 \times 10^{-6}$ Torr |
| Sputtering gas (Ar) pressure | 4–8 m Torr |
| Sputtering power | 40–60 watts |
| Frequency | 13–14 MHz |
| Deposition Rate | 0.5–1 Å/second |
| Deposition Time | 20–25 minutes |
| Film Thickness | 750–1250 Å |
| Substrate Temp. | Ambient–300° C. |

TABLE 3

| Evaporation Deposition Parameters | |
| --- | --- |
| Parameter | Typical Range |
| Base pressure | $1 \times 10^{-6} - 5 \times 10^{-6}$ Torr |
| Evaporation Temp. | 450–600° C. |
| Deposition Rate | 0.5–3.5 Å/second |
| Deposition Time | 3–20 minutes |
| Film Thickness | 750–1250 Å |
| Substrate Temp. | Ambient |

Experimental data obtained by analyzing thin films deposited pursuant to the evaporation parameters set forth in Table 3 demonstrates that the Fermi level position for the F.C.C. phase has been moved adjacent the edge of the valence band (i.e. the F.C.C. phase behaves as a semi-metal with 0.0 eV activation energy). Note that the as deposited evaporated films are amorphous and subsequently subjected to a thermal anneal in order to obtain the crystalline face centered cubic lattice structure. In contrast thereto, the Fermi level positions for the hexagonal crystal structure (which is achieved through the input an additional electrical or optical pulse) have been actually moved into the valence band (i.e., exhibits "degenerate semiconductor" behavior in which the hexagonal phase behaves as a metal). The reasons for the differences in switching behavior which exist between thin films deposited by sputtering vis-a-vis those deposited by evaporation are not entirely understood. Experimental evidence tends to demonstrate that impurities caused by the presence of oxygen in the sputtered film are responsible for the differences in the Fermi level positions. This will be discussed hereinafter with specific reference to FIGS. 14a and 14b. However, it is noteworthy that oxygen was not intentionally introduced into the sputtering apparatus, but rather, was unintentionally incorporated into the cathode target material. Its presence was later analytically discovered. It is also important to note that evaporated films deposited on a heated substrate will exhibit anisotropic growth characteristics in which oriented layers of the chalcogenide elements are successively deposited. Whether this proves to be significant for electrical applications has yet to be proven; however, this type of film holds a great deal of promise for other fields such as thermoelectricity or for specific semiconductor applications.

The layer of memory material 36 is preferably deposited to a thickness of about 200 Å to about 5,000 Å, more preferably of about 400 to about 2,500 Å and most preferably of about 50 to about 1,250 Å in thickness. The lateral dimension or diameter of the pore of semiconductor material 36 may be in the range of less than about one to two micrometers, although there is no practical limit on the lateral dimension. It has been determined that the diameter of the actual conductive path of the high conductivity material is significantly less than a micrometer. The pore diameter can thus be as small as lithography resolution limits will permit. Note that the inventors have been unable to analyze the material within the pore to ascertain switching characteristics; but the analysis described herein was conducted on thin films which more readily lend themselves to x-ray and other experimentation.

In a preferred embodiment of the present invention, the pore diameter is selected such that it conforms substantially with the diameter of the low resistance path which is formed when the material is switched to the low resistance state. The diameter of the pore of memory material 36 is therefore preferably less than about one micrometer so that the volume of the memory material 36 is limited, to the extent lithographically possible, to the volume of the material 36 which is actually switched back and forth between the various states of resistance. This further reduces the switching time and the electrical energy required to initiate the detectable change in resistance. The term "pore diameter" as used herein shall mean the lateral cross-sectional dimension of the layer of memory material 36 which extends under the contact regions foraged with the memory layer 36 and with the lower p+ layer and the upper conductors 42 as shown in the embodiment of FIG. 1 and, in the case of the embodiment of FIG. 2, with the lower metal layer 29 of the Schottky diode.

It is further preferred that the pore regions of the memory elements 30 be thermally isolated and/or controlled except for such electrical contact with the upper and lower electrodes as is necessary for proper operation of the memory elements. This further confines, limits and controls the heat transfer from the switched volume of the pore and the electrical energy required for the resistance transitions. This is accomplished in the embodiments of FIGS. 1 and 2 by the oxide layers 20 and 39 which surround the lateral peripheral portions of the memory elements 30. The layers 32, 34, 36, 38 and 40 are etched and an oxide layer 39 is formed thereover and etched to leave openings above the memory elements 30 as shown. Alternatively, the memory elements may be formed in a two step etch process with layers 32 and 34 being first deposited and then etched over the top of which the remaining layers 36, 38 and 40 are deposited and then separately etched to the selected dimension.

Deposited on top of the entire structure formed by layers 32, 34, 36, 38, and 40 is the second electrode grid structure formed of aluminum conductors 42, which extend perpendicular in direction to the conductors 12 and complete the x-y grid connection to the individual memory elements. Overlaying the complete integrated structure is a top encapsulating layer 44 of a suitable encapsulant such as $Si_3N_4$ or a plastic material such as polyamide, which seals the structure against moisture and other external elements which could cause deterioration and degradation of performance, particularly of the phase change materials in the memory layer 36. The $Si_3N_4$ encapsulant can be deposited, for example, using a low temperature plasma deposition process. The polyamide material can be spin deposited and baked after deposition in accordance with known techniques to form the encapsulant layer 44.

Figure 2:
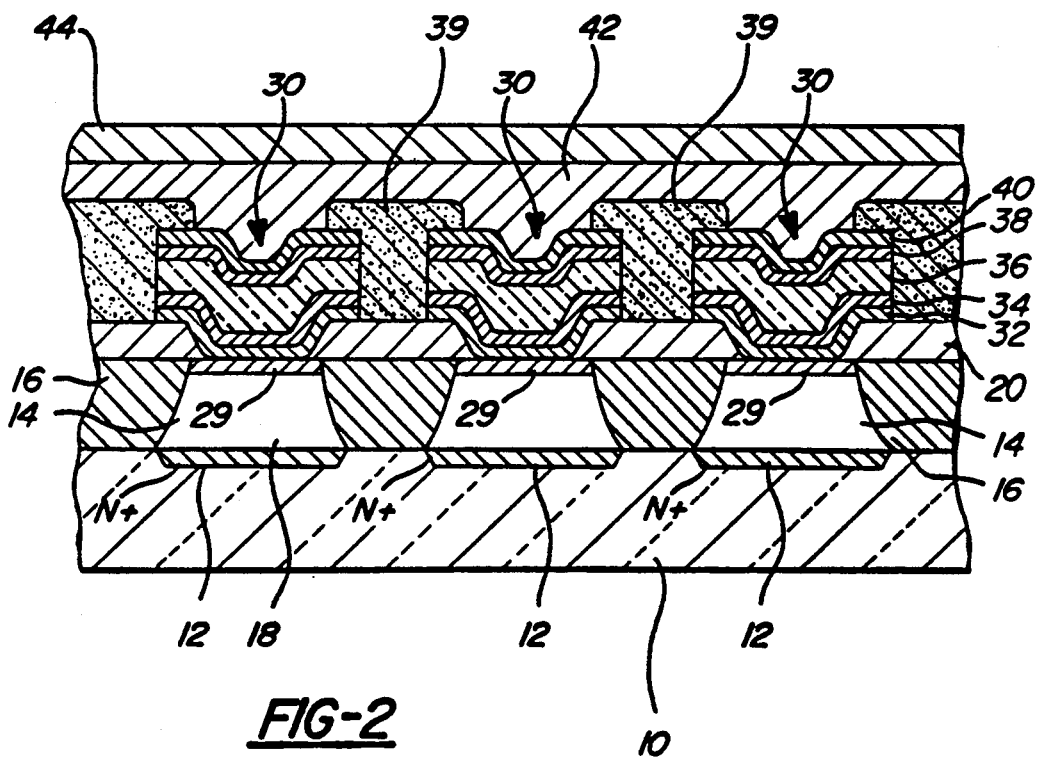
FIG. 2 is a fragmentary cross-sectional view illustrating a portion of an integrated circuit, said circuit depicting an electrically erasable and directly overwritable multilevel memory configuration of a second preferred embodiment of the present invention.
Figure 3:
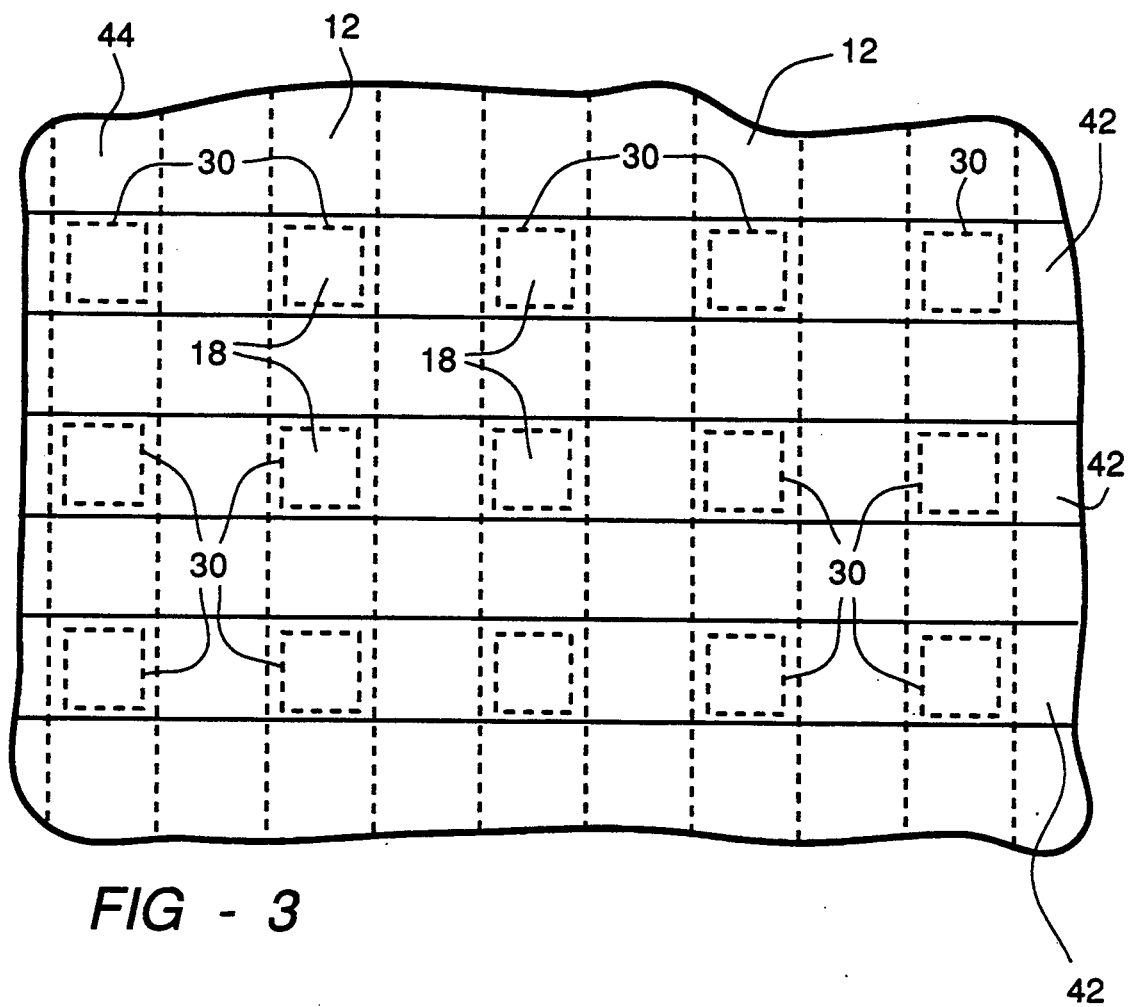
FIG. 3 is a top plan view schematically illustrating a portion of the integrated circuit configurations of FIGS. 1 and 2.

The embodiment of FIG. 2 is the same as FIG. 1 except that a diode 27 is formed as a Schottky barrier operatively disposed between the n layer 14 and a metal layer 29 which may be, for example, platinum silicide. In other respects, the structural embodiment of memory cell/isolation element depicted in FIG. 2 is formed in the same manner as that of FIG. 1 and like elements are labeled with like reference numerals. The integrated structure thus formed is an x-y memory matrix connected as shown in FIG. 3 in which each memory element 30 is connected in series with a diode 26 between a horizontal x-line 42 and a vertical y-line 12. The diodes 26 serve to electrically isolate each of the memory elements 30. Other circuit configurations for the electrically erasable memory of the present invention are, of course, possible and feasible to implement. One particularly useful configuration is a three dimensional, multi-level array in which a plurality of planes of memory elements and their respective isolation devices are stacked upon one another. Each plane of memory elements is arranged as a plurality of rows and columns of memory elements, thereby allowing for X-Y addressing. This stacking of planes, in addition to increasing memory storage density, allows for an additional Z dimension of interconnection.

It is important to note that conventional CMOS technology cannot be used to produce this type of three dimensional memory array since CMOS technology builds the required semiconductor devices into the bulk of single crystal semiconductor wafers and, therefore, can only be used to fabricate a single layer of devices. Furthermore, (1) CMOS cannot produce a small enough footprint (actual element dimension) to cost effectively produce large arrays and (2) CMOS devices, because they exist in a single plane, cannot be interconnected along the Z direction. Therefore, CMOS devices cannot be fabricated with the complex, three-dimensional interconnectivity required for advanced parallel processing computers. The three-dimensional, thin-film memory array structures of the instant invention, on the other hand are capable of both conventional serial information processing as well as parallel information processing.

Parallel processing and therefore multidimensional memory array structures are required for rapid performance of complex tasks such as pattern recognition, classification or associative learning etc. Further uses for and description of parallel processing are presented in U.S. patent application Ser. No. 594,387, filed Oct. 5, 1990, which is assigned to the assignee of the instant application and the disclosure of which is hereby incorporated by reference. With the integrated structure as shown in the embodiment of FIGS. 1 and 2; however, a completely vertically integrated structure of the memory element and its isolating diode is formed, thus minimizing the area occupied on the substrate by each of the combinations of memory elements and diodes. This means that the density of the memory elements in the chip is limited essentially only by the resolution capabilities of the lithography.

Figure 4:
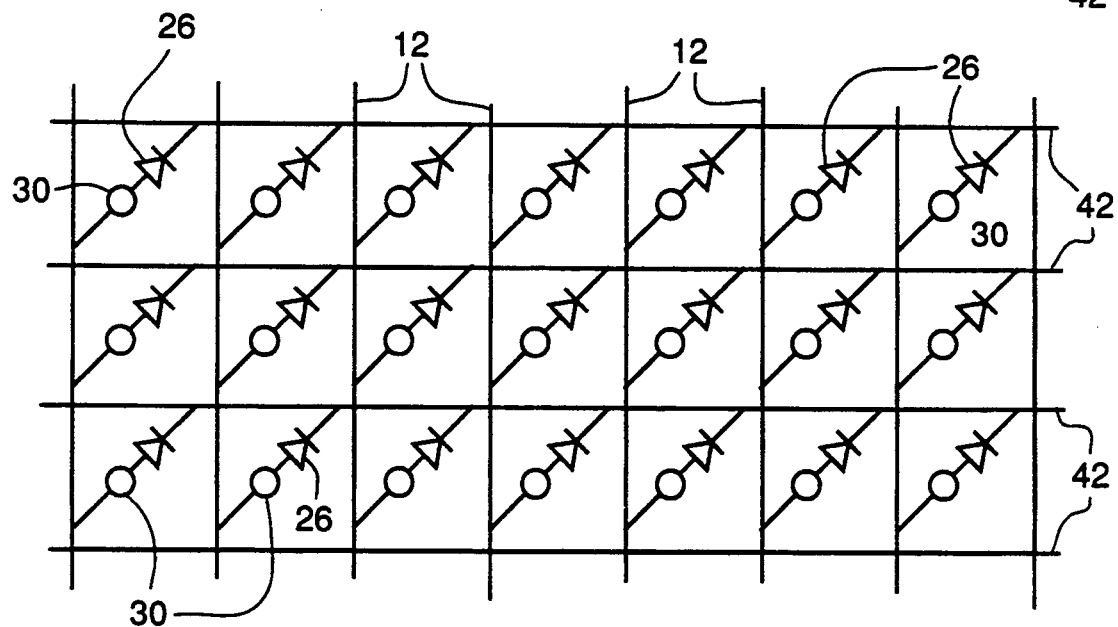
FIG. 4 is a schematic circuit diagram illustrating a portion of the X-Y matrix array of isolation elements in combination with the memory elements of the integrated circuit configurations of FIGS. 1 and 2.

FIG. 4 is a stylized, schematic circuit diagram of a portion of the memory cell embodiments of FIGS. 1-3. The circuit comprises an x-y grid with each of the memory elements 30 being electrically interconnected in series with a diode 26 at the cross points of the x address lines 42 and the y address lines 12 as shown. The address lines 12 and 42 are connected to external addressing circuitry in a manner well known to those skilled in the art. The purpose of the x-y matrix of memory elements in combination with isolation elements is to enable each one of the discrete memory elements to be read and written without interfering with information stored in adjacent or remote memory elements of the matrix.

Figure 5:
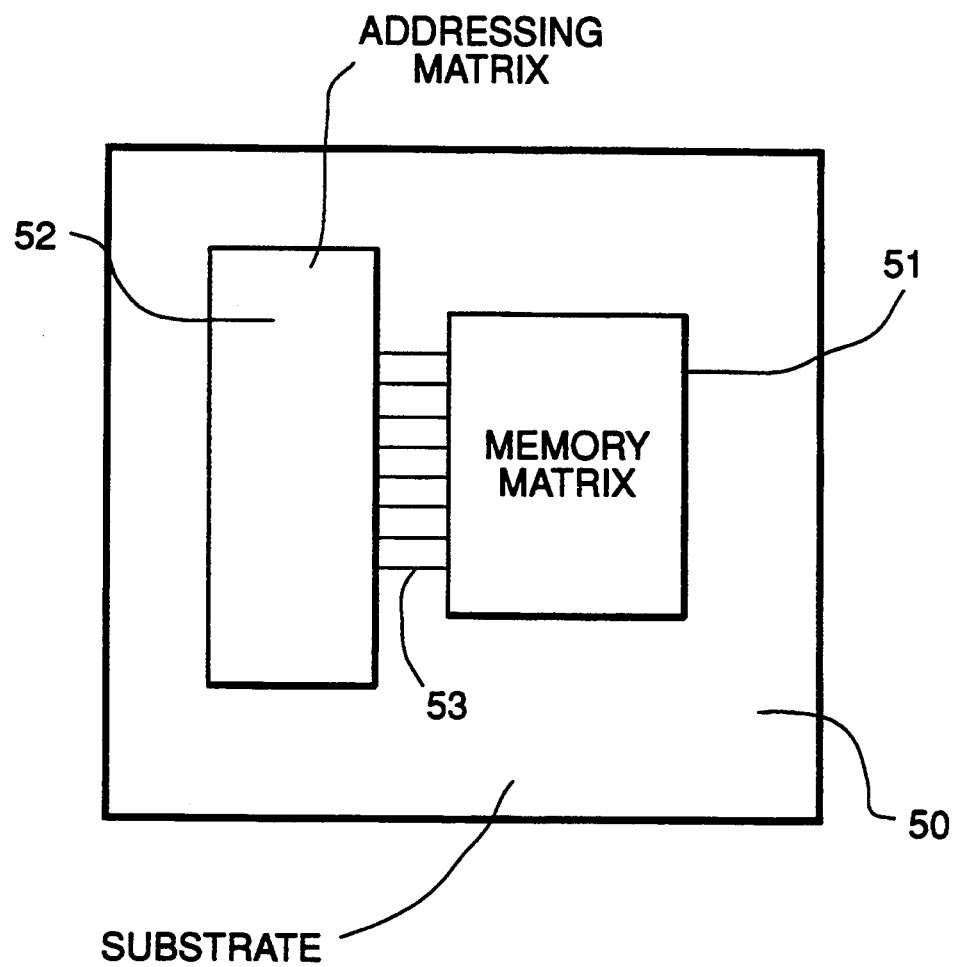
FIG. 5 is a schematic representation illustrating a single crystal semiconductor substrate with the integrated memory matrix of the instant invention as depicted in FIGS. 1 and 2 placed in electrical communication with an integrated circuit chip on which the address/drivers/decoders are operatively affixed.

In FIG. 5, there is diagrammatically illustrated a portion of a single crystal semiconductor substrate 50 with a memory matrix 51 of the present invention formed thereon. Also formed on the same substrate 50 is an addressing matrix 52 which is suitably connected through integrated connections 53 to the memory matrix 51. The addressing matrix 52 includes signal generating means which define and control the setting and reading pulses applied to the memory matrix 51. Of course, the addressing matrix 52 may be integrated with and formed simultaneously with the solid state memory matrix 51.

In prior an semiconductor memories having the relatively high switching speeds and low switching energies deemed necessary for most applications thereof, at least one transistor and a capacitor is required for each memory element. The formation of such memories in integrated circuit form requires at least three connections along with other additional complexities which occupy a certain minimum substrate area regardless of how the integrated circuit is laid out. The integrated circuit configuration of the electrically erasable memory of the present invention requires only two connections to each memory element and these are made in vertical relationship to each other. Further, each memory element, complete with isolating diode and the pair of contacts for the element, is itself fully vertically integrated such that a significantly higher bit density is possible with respect to that possible with prior art integrated circuits performing the same or similar functions.

In fact, the memory of the present invention provides for a bit density which is greater than that attainable even in solid state dynamic random access memories (DRAMs), which are volatile and therefore lack the further advantages that the non-volatility attainable with the present invention provides. The increase in bit density attainable with the present invention translates into a corresponding reduction in manufacturing costs because of the smaller areas of the wafer occupied per bit of the integrated circuit configuration. This allows the memory of the present invention to compete with and surpass other available memories for a wider range of applications, not only in terms of electrical performance and memory storage capacity, but also in terms of cost.

By comparison with prior an semiconductor memories formed of at least one transistor and a capacitor for each bit, the integrated circuit configurations of the present invention, as shown in FIGS. 1 and 2, can be formed on a chip with greater bit density compared to prior art configurations using the same lithography resolution. In addition to the cost advantages that the higher bit density affords, the performance parameters of the memory in the integrated circuit configuration of the present invention are thus even further improved in that the elements are positioned closer together and lead lengths, capacitances, and other related parameters are further minimized, thereby enhancing performance.

Through the use of the novel semiconductor materials of the instant invention, the energy required to effect a change of Fermi level position and a corresponding change in electrical conductivity has been reduced by orders of magnitude. Further, it is now believed that even the picojoule energies thought to be necessary by the present invention, can be further lowered by reducing the time duration of the electrical pulses. Additionally, reductions in the thickness of the material could further reduce the pulse energy required to set a memory element to a given resistance value. However, the thickness requirement must be balanced against the realities of modem wafer fabrication processing. It appears that the optimum thickness for the memory material of the instant invention is on the order of 500 to 1,0000 Å to achieve 1 to 10-nanosecond switching speeds.

The following section of the detailed description is intended to explain the manner in which the understanding of the scope and ramifications of the disclosed discovery has evolved. The history of its evolution is significant in providing a full explanation of the enabling embodiment of this invention, particularly with respect to the impact of the chalcogenide materials on the general class of electronic devices aside from and in addition to memory elements. While the novel homogeneous semiconductor materials of the present invention can apply to a wide class of elements and compositions, for purposes of explanation, the discussion which follows below will deal with one specific example, i.e., a Ge—Sb—Te system.

Crystalline GeTe, grown from the melt, has a rhombohedrally distorted (88.2° instead of a 90° NaCl (i.e. face-centered cubic)) structure at room temperature. This structure changes to a face centered cubic structure above 400° C. The origin of the rhombohedral distortion and, in particular, the relation of that distortion to the concentration of Ge vacancies in the highly conductive p-type GeTe is not clear yet. In this rhombohedrally distorted crystalline state, GeTe exhibits metallic conductivity ($\approx 10^{-3}$–$10^{-4}$)(ohm-cc)$^{-1}$. In thin film form, GeTe can be grown in the amorphous phase and at about 200° C., crystallizes into the face centered cubic structure. This metastable face centered cubic phase is stable at room temperature because of the microcrystalline structure of the films. However, at annealing temperatures above 400° C., the face centered cubic structure changes to the stable hexagonal or rhombohedral structure depending on Sb content.

In the ternary Ge—Sb—Te system, the substitution of Sb for Ge in TeGe results in properties similar to that of a pure GeTe crystal. In bulk form, the stable room temperature phase is the hexagonal phase, but it is believed that it changes to the face centered cubic phase at higher temperatures. When annealed, thin films of the amorphous state first crystallize into the face centered cubic phase at temperatures of about 200° C.; however, upon annealing to higher temperature, they change into the hexagonal phase. This structural transition occurs at a temperature that depends on the specific composition of the film.

The optical and electrical properties of thin films of amorphous and crystalline Ge—Sb—Te material have been characterized. In the amorphous state, the optical band gap, from optical absorption measurements, has been shown to be insensitive to concentrations of Sb from 0 to 35 atomic % and has been measured at about 0.7 eV. The electrical activation energy of the material decreases slightly from about 0.4 eV in the amorphous GeTe system to about 0.35 eV in the $Ge_{22}Sb_{22}Te_{56}$ system.

Upon annealing, amorphous films, regardless of composition, crystallize into the face centered cubic phase. The electrical conductivity of these films increases from about $10^{-3}$ (ohm-cm)$^{-1}$ in the amorphous phase to about 1 (ohm-cm)$^{-1}$ in the face centered cubic crystalline phase. This transition occurs at approximately 180° C. The Fermi level position for this face centered cubic lattice is about 0.18 eV which is approximately half the measured optical band gap of about 0.4 eV. Further annealing in the range of about 180° to about 300° C. does not change either the electrical conductivity or the optical transmission of the material. The infrared absorption, measured in the range of 1 to 50 microns is negligible, which indicates a relatively low concentration of free charge carriers in the face centered cubic structure.

Thermal annealing at 350° C. results in a further phase transition to the hexagonal crystalline lattice structure. In this state of the lattice, the electrical conductivity further increases to about 100 (ohm-cm)$^{-1}$ and a strong free carrier absorption appears following the known relation $\alpha = A\lambda^2$, where $\alpha$ is the absorption coefficient, $\lambda$ is the wavelength of incident light and A is a constant proportional to the number of free carriers. In accordance with our measurements, the optical band gap of the material does not significantly change after the phase transformation between the face centered cubic and the hexagonal states has occurred. However, a strong ($\approx 25\%$) increase in reflectivity has been measured.

In order to cycle the novel memory element of this invention, a process is required in which a relatively high level of energy is applied to the material prior to its initial use to convert the material from an amorphous into a first crystalline state. The Fermi level position for this crystalline state is on the order of about 0.18 eV, which is the same as the Fermi level position reported above for the face centered cubic structure, providing for the conclusion that the material has undergone a phase transformation from the amorphous into a face centered cubic crystalline lattice structure. Also, upon the application of additional, lesser amounts of energy, the Fermi level position was lowered, which indicates that the material has undergone a further crystalline phase transformation into the hexagonal crystalline lattice phase described above. Thus, it has been conclusively established that the stable modulation of the crystallites of the microcrystalline semiconductor material of the present invention, into and through a range of different Fermi level positions, is accomplished by changing and cycling the crystalline lattice structure of the grains of this material. The reversible change in electrical conductivity exhibited by this microcrystalline semiconductor material is provided at least within one crystalline phase of the material. This change in the value of electrical conductivity is about two orders of magnitude, which closely corresponds to the difference in the dynamic range of the resistance of the electrical memory elements of the present invention as measured in the laboratory for the bulk material.

In order to convert the material from a crystalline state such as the face centered cubic state to a state of lesser stability, it is necessary to employ a shorter, highly energetic electrical pulse. This is believed to be the mechanism for electrical switching in one embodiment of the instant invention. For example, in this interpretation, a 30 nanosecond pulse is able to transform the hexagonal lattice structure in a thin film of microcrystalline chalcogenide material into the face centered cubic lattice structure. By measuring the free charge density before and after laser annealing, it was found that no significant free carrier absorption takes place. This suggests that crystalline films in the face centered cubic structure have a lower concentration of thermally excited free charge (holes) as opposed to the films in the hexagonal phase, which may be thought of as a p-type, highly degenerate semiconductor material (because the Fermi level has been moved adjacent to, or all the way into, the valence band).

It is noted that the end points of the dynamic range of electrical conductivities (determined by the Fermi level positions) set forth in the present invention do not necessarily correspond to a change of crystalline states between the face centered cubic and the hexagonal lattice structures. Rather, what is more significant is the fact that the material of the present invention need never revert back to the amorphous structure and, thus, the end points in the dynamic range of electrical conductivities may both result from one or more crystalline lattice structures and can therefore be attained with relatively low energy inputs and at very high speeds.

The possibility of utilizing a thermal model to explain the plurality of stable intermediate levels within the dynamic range of activation energies between the two end points defined by the crystalline phases detailed above has been considered. In this respect, the presence of the multiple states and the rapid response of the material to an electrical field cannot be reconciled by a thermal model. Any explanation must take into account the kinetics and equilibrium conditions of crystalline-to-crystalline phase transitions.

If one considers that the concentration of free charge and the structure of the crystalline lattice are to some extent uncoupled, there is a possible mechanism that could be employed to provide information helpful in understanding the presence of the multiple stable intermediate states. It is known that the presence of an external electrical field will cause charge to drift and thereby strain the lattice. The two responses are independent. In order to change the number of vacancies in the tellurium-antimony matrix, germanium and or antimony atoms have to be moved. It is possible that the response of the strained lattice during the application of an external field is to either break some bonds and create additional acceptor levels (higher concentration of holes within the lattice) or to simply move non-bonding lone pair electrons. The end result is only dependant upon the initial crystalline state of the microcrystalline material or, in other words, the end result is independent of the previous amorphous or crystalline state of the material.

Figure 6:
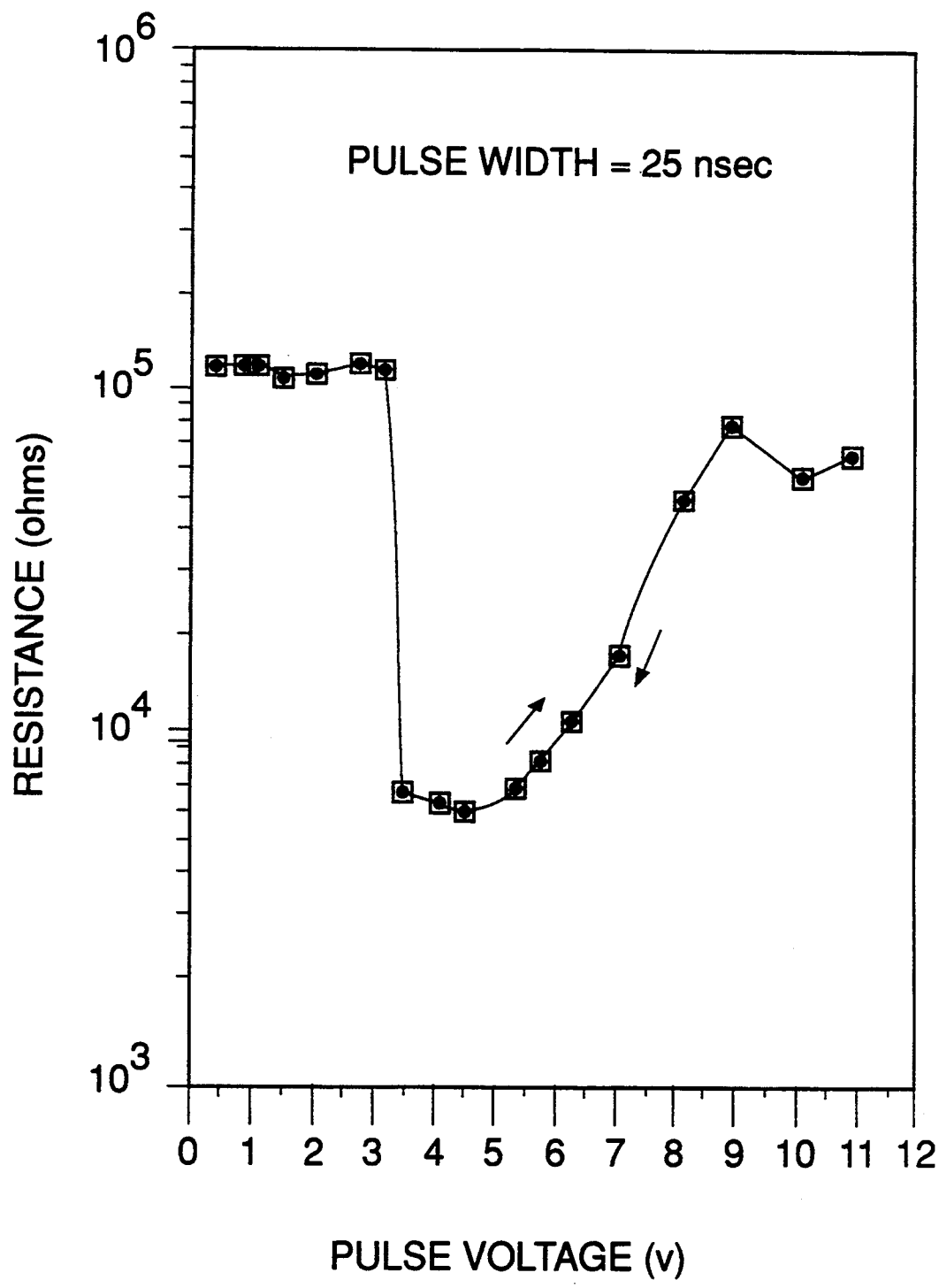
FIG. 6 is a graphical representation in which device resistance is plotted on the ordinate and signal pulse voltage is plotted on the abscissa, said graph illustrating the multilevel storage capabilities of single memory cell elements of the instant invention.

Returning to the drawings, FIG. 6 is a graphical representation in which the resistance of memory elements formed of the novel semiconductor material of the instant invention is plotted on the ordinate and the applied pulse voltages for pulse durations of 25 nanoseconds are plotted on the abscissa. This figure clearly demonstrates, inter alia, the wide dynamic range of resistance values attainable with the particular semiconductor material, device structure and size. The dynamic range of electrical resistances illustrated for this specific device is greater than about one order of magnitude. The data in FIG. 6 shows a constant resistance value for input pulses of less than about 3 volts. When a 3 volt pulse is applied, the device resistance instantaneously drops to about $6 \times 10^3$ ohms, which value corresponds to the low resistance end of the dynamic range. Upon the application of higher electrical voltage pulses, from 4 volts to 9 volts, the device resistance increase linearly to about $7 \times 10^4$ ohms, which corresponds to the high resistance end of the dynamic range. The linearity of this resistance versus voltage plot, as well as the remarkable ability to proceed in both directions along this plot, without being reset into the "starting state" is to be noted. It is this wide dynamic range, the linearity of the plot, and the ability to move in both directions along the plot that provides that this homogeneous body of semiconductor material may be used for memory applications characterized by directly overwritable, multilevel storage capabilities.

Through experimentation, the inventors have shown that factors such as pore dimensions (diameter, thickness, and volume), chalcogenide composition, thermal preparation (post deposition anneal), signal pulse duration, impurities such as oxygen present in the composition, crystallite size and signal pulse waveform shape have a dramatic effect on the magnitude of the dynamic range of resistances, the absolute end-point resistances of said dynamic range, and the voltages required to set the device at these resistances. For example, relatively thick chalcogenide films (i.e., over 4,000 Å) will result in higher set voltage requirements (i.e. 15-25 volts), while relatively thin chalcogenide layers (i.e. less than about 500 Å) will result in lower set voltage requirements (i.e. 1-7 volts). Of course, the possible significance of crystallite size and, therefore, the ratio of the number of surface atoms relative to the number of bulk atoms has previously been described.

The signal pulse duration required to set the memory element to the desired resistance level within the dynamic range of electrical resistances will likewise be dependent upon all of the foregoing factors as well as signal voltage. Typically, signal pulse durations will be less than about 250 nanoseconds and preferably less than about 50 nanoseconds. It is to be stressed that even the short 25 nanosecond pulse widths noted in FIG. 6 hereof are dependent on the size and shape of the pore as well as the thickness and composition of the semiconductor alloy employed. It is believed that the pulse durations can be significantly reduced without interfering with the operation of the memory switch. As a matter of fact, with the input of lesser amounts of energy, the cycle life of the elements can only increase.

A feedback loop which reads and, when required, adjusts the resistance of a given memory element may be incorporated into the memory systems of the instant invention. For example, this would take into account the possibility that a memory element may initially be set at a desired resistance; however, in time the resistance of the element may drift slightly from the value at which it was originally set. The feedback loop, in this instance, would calculate and deliver a refresh signal pulse of the required voltage and duration to the memory element to bring it back to a preselected resistance value. Also, circumstances may exist where the set pulse delivered to a memory element may not result in setting of the element at the desired resistance value. In this case the feedback loop would deliver additional signal pulses to the element until the desired resistance level is achieved. The total duration of this series of set/adjust cycles is less than about 1,000 nanoseconds and preferably less than about 500 nanoseconds.

The ability to reversibly move up and down the linear portion of the resistance versus voltage curve cannot be overemphasized. As indicated by the arrows in FIG. 6, a signal pulse of a selected voltage will set the memory element to a desired resistance, regardless of the previous set condition thereof. This ability to reversibly move along the curve provides for direct overwrite of previously stored data. Such direct overwrite capability is not possible with the phase change and MSM (a-Si) memory materials of the prior an. This ability to reversibly set intermediate resistance values is remarkable. A thousand successive 5-volt pulses achieves the same resistance value as an 8-volt pulse followed by a single 5-volt pulse or a 4-volt pulse followed by a single 5-volt pulse. It is therefor no wonder that an explanation of the physics of the remarkable operation of this revolutionary material is so difficult.

The dynamic range of resistances also allows for broad gray scale and multilevel analog memory storage. This multilevel memory storage is accomplished by dividing the broad dynamic range into a plurality of sub-ranges or levels. This analog storage ability allows for multiple bits of binary information to be stored in a single memory cell. This multilevel storage is accomplished by mimicking multiple bits of binary information in analog form and storing this analog information in a single memory cell. Thus, by dividing the dynamic range of resistances into 3 or more analog levels, each memory cell would be provided with the capability of storing 1 and ½ or more bits of binary information.

FIG. 7 is a tabular representation of electrical and optical data generated from typical Te—Ge—Sb compositions belonging to the novel class of semiconductor materials of the present invention. This data was generated from samples deposited by sputtering and then being subjected to a post deposition thermal anneal in air. As can be seen from this data, the as prepared amorphous phase has a band gap of about 0.7 eV, a Fermi level position of about 0.37 eV, and an optical reflectivity of about 35%. This material, when in the amorphous phase, behaves as an intrinsic narrow band gap semiconductor. However, it is the electrical and optical characteristics of the two crystalline lattice phases into which the amorphous material can be modulated that are of particular interest. The "as prepared" face centered cubic phase of that same composition has a band gap of about 0.4 eV, a Fermi level position of about 0.18 eV, an optical reflectivity of 48%, and behaves as an intrinsic narrow band gap semiconductor material. Further, the hexagonal phase of that sample has a band gap similar to the face centered cubic phase, but has a wide dynamic range of Fermi level positions ranging from about 0.0 to about 0.18 eV depending on the state of thermal anneal. The hexagonal phase has an optical reflectivity range of about 48 to about 73% and behaves as a narrow band gap, p-type, degenerate semiconductor material. This range of Fermi level positions and the resultant wide dynamic ranges of electrical (conductivity/resistance) and optical (reflectivity) properties allows for gray scale electrical and optical storage of information. The degenerate behavior, i.e., the movement of the Fermi level position into the valence band edge, is remarkable. The concentration of free charge must be very high in order to measure this behavior in a narrow band gap material wherein thermal charge generation normally swamps such extrinsic behavior. Therefore, this high concentration of holes is one of the most significant aspects of the invention.

Figure 8A:
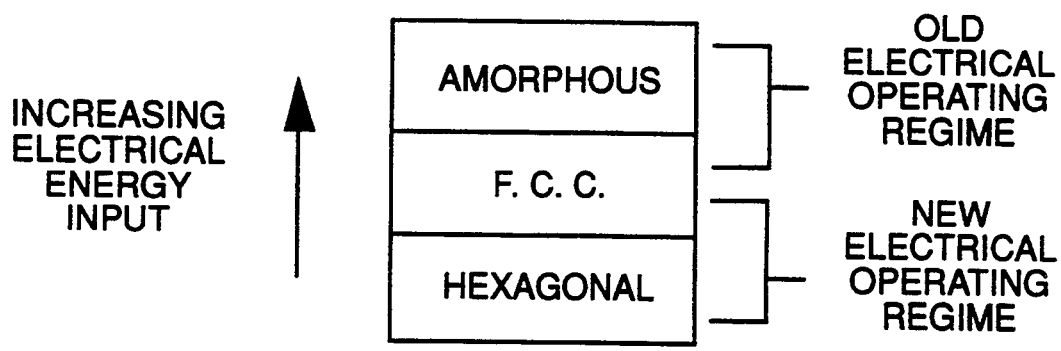
FIGS. 8a and 8b are schematic representations relating the amorphous and crystalline phases of the novel semiconductor material of the instant invention to increasing electrical energy input and increasing electrical conductivity, respectively, these figures also depicting the electrical operating regimes of the prior art memory elements as compared to those of the instant invention.
Figure 8B:
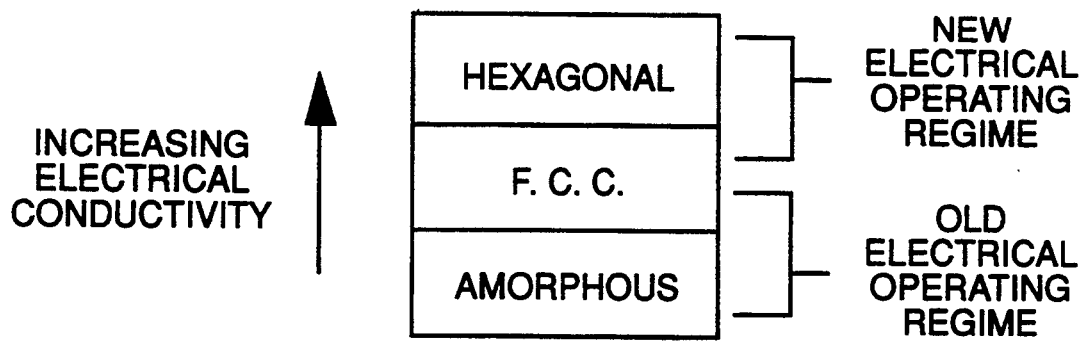

FIGS. 8a and 8b are schematic representations relating the amorphous and crystalline phases of the novel electrically operated memory elements of this invention to increasing electrical energy input and increasing electrical conductivity, respectively. As can be seen from these figures, the switching modulations of the instant electrical memories require much less energy than those of the prior art. Based upon our present understanding, this is not surprising. All prior art materials relied upon amorphous-to-crystalline phase transitions; whereas the instant materials operate on either crystalline-to-crystalline phase transitions or operate within a single crystalline phase and the increase in electrical conductivity resulting from these phase transitions.

The inventors speculate that the materials actually operate at the extreme ends of the hexagonal lattice structure so it is not surprising that a very low energy input can cause significant changes in Fermi level position and resistance values. Further, the inventors speculate that a change to the hexagonal/rhombohedral phase from the face centered cubic phase could be explained by movement by as few as 2% of the germanium and/or antimony atoms from the crystallite in attempt to assume a preferred compositional ratio ($Te_{52}Ge_{48}$ is preferred in the binary composition). Since the loss of each atom provides the crystallite with an extra hole, there would be an increase in free charge concentration per cubic centimeter on the order of $10^{21}$, a value which would not be masked by thermal generation in this narrow band gap material. It is this type of increase in free charge concentration which will be referred to herein as "self-doping" or "self-compensation. It is additionally noteworthy that the band gap of these semiconductor compositions can be widened or further narrowed by alloying.

Figure 9A:
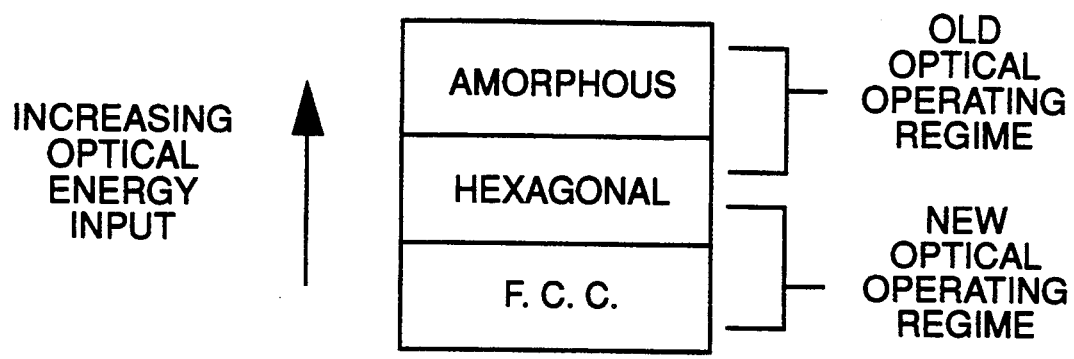
FIGS. 9a and 9b are schematic representations relating the amorphous and crystalline phases of the novel semiconductor material of the instant invention to increasing optical energy input and increasing optical reflectance (at 830 nm), respectively, these figures also depicting the optical operating regimes of the prior art memory media as compared to those of the instant invention.
Figure 9B:
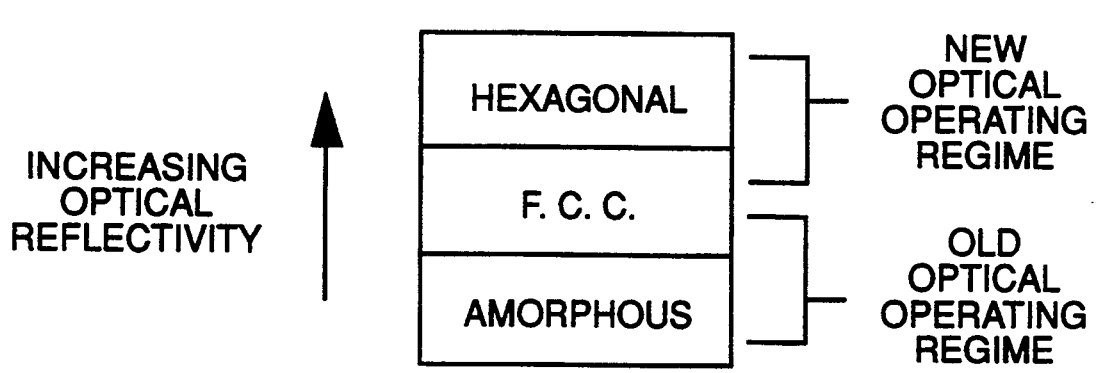

FIGS. 9a and 9b are schematic representations relating the phase of the novel semiconductor material of the instant invention to increasing optical energy input and increasing optical reflectance (at 830 nm), respectively, for specific application of the material for optical memories. As in the case of the electrical modulation of free charge, by operating within a single crystalline phase or within closely related crystalline structures, the optical memory of the present invention requires an optical energy input for the modulation of charge that is orders of magnitude lower than the optical materials of the prior art.

Figure 10:
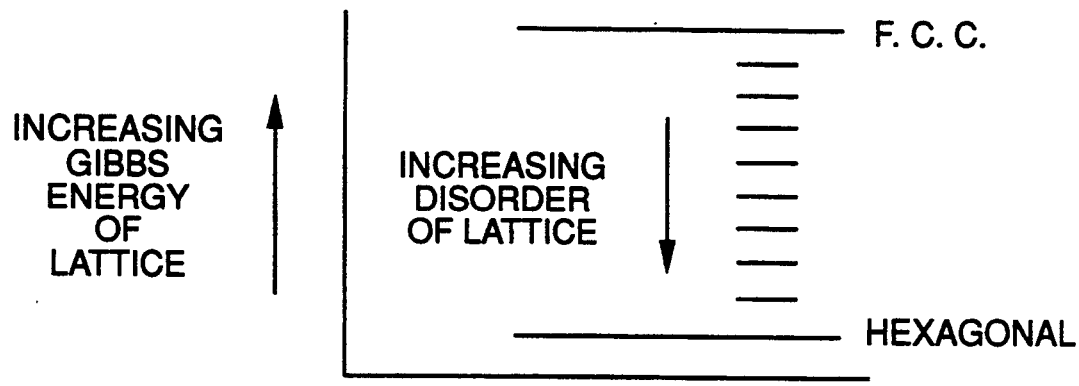
FIG. 10 is a graphical representation of the relative Gibbs Energy of the face centered cubic and hexagonal crystal lattice structures of the two crystalline phases of the semiconductor materials of the instant invention, and specifically illustrating the presence of a plurality of stable intermediate energy levels therebetween.

FIG. 10 is a graphical representation of the relative Gibbs Energy of the face centered cubic and hexagonal crystal lattice structures of the present invention and shows the intermediate values of resistance (corresponding to Fermi level positions) which can be accessed either electrically or optically. This graph represents material which exists in face centered cubic and hexagonal forms at thermodynamic equilibrium. This figure also depicts the increasing disorder as the lattice of that material changes from a face centered cubic structure to a hexagonal structure.

Figure 11A:
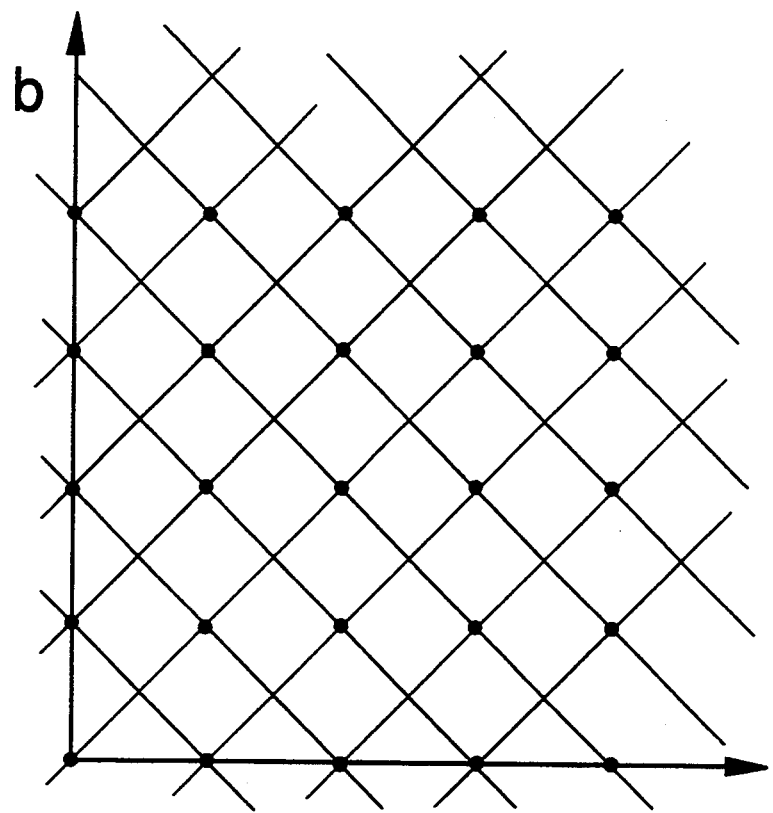
FIGS. 11a and 11b are schematic depictions of two dimensional, planar views of the face centered cubic and hexagonal (having rhombohederal symmetry) crystal lattice structures, respectively, of the novel semiconductor materials of the present invention, said depictions intended to illustrate that only a very slight distortion/relaxation of the crystalline lattice is necessary to transition therebetween.
Figure 11B:
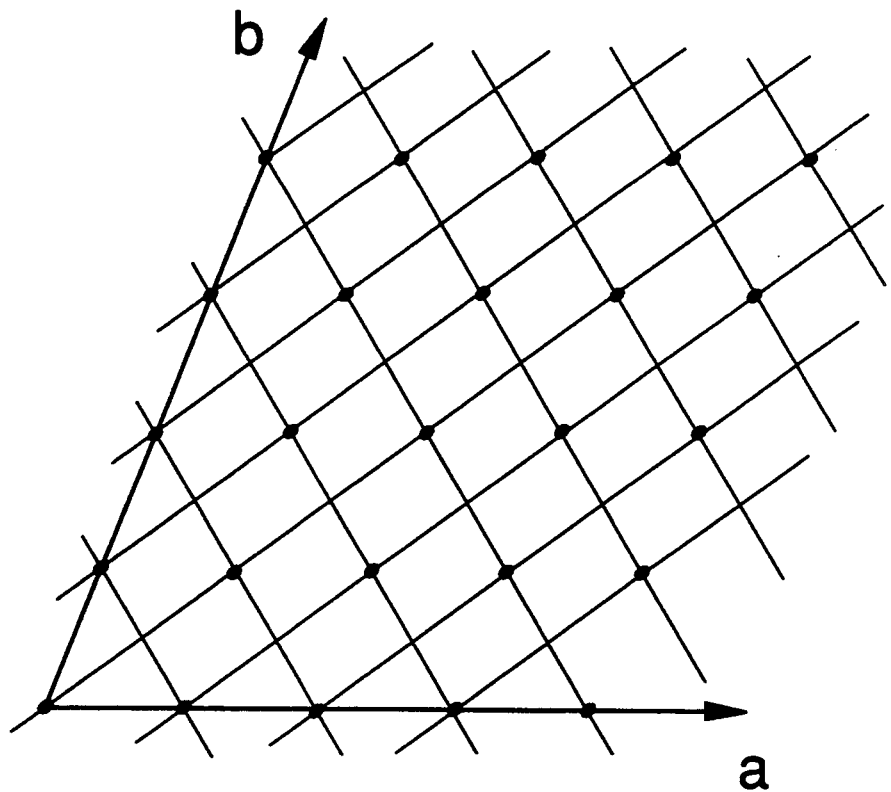

FIGS. 11a and 11b stylistically depict two dimensional, planar views of the face centered cubic and hexagonal (having rhombohedral symmetry) crystal lattice structures, respectively, of the novel semiconductor materials of the present invention. As can be seen, the two lattice structures are substantially the same except for the fact that the angle between the "a" and "b" axes is 90° for the face centered cubic lattice while the angle is about 88.2° for the hexagonal lattice (the angle in FIG. 11b is not drawn to scale). Again, it is speculated that with the input of energy, the material prefers a germanium and/or antimony deficient structure which is attained by increasing its entropy and disordering the lattice. Because this atomic deficiency amounts to about 2% of the total number of germanium and/or antimony atoms, the result is increased electrical conductivity.

Figure 12A:
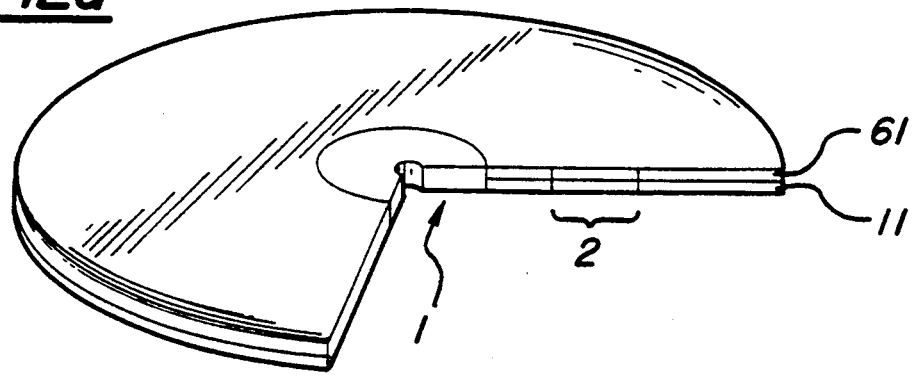
FIG. 12a is a partially cut-away isometric view, not to scale, of an optical memory disk incorporating the novel semiconductor material of the present invention.
Figure 12B:
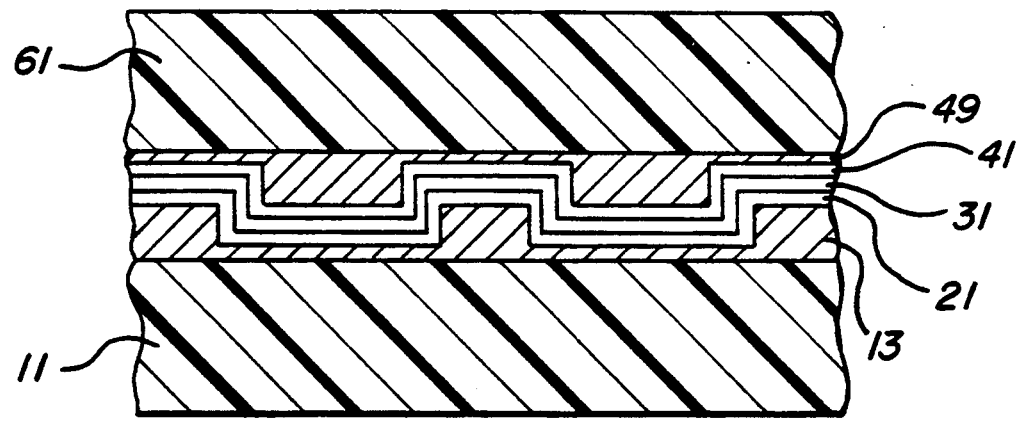
FIG. 12b is a detailed, partially cut-away, cross-sectional view of a part of the optical memory disk of FIG. 12a illustrating the relationship of the various layers thereof.

FIGS. 12a and 12b illustrate an optical memory disk 1 which includes a substrate, for example a plastic substrate 11, a first encapsulating dielectric layer 21, e.g., a first germanium oxide encapsulating layer), the novel chalcogenide semiconductor material layer 31, a second dielectric layer 41, (e.g., a second germanium oxide layer 41), and a second plastic substrate 61.

FIG. 12b is a cross-sectional view of the optical memory disk 1 of FIG. 12a depicting, in greater detail, the various layers of the disk. As shown, the substrate 11 is a polymeric sheet (e.g., a polymethylmethacrylate sheet). The substrate 11 is an optically invariant, optically isotropic, transparent sheet, the preferred thickness of which is from about 1 mm to about 1.5 mm.

Atop the substrate 11 may be a film, sheet, or layer 13, (e.g., a polymerized acrylic sheet). Polymerized, molded, injection molded, or cast into the polymeric sheet 13 may be grooves. Alternatively, the grooves may be in the substrate 11, in which case the film, sheet, or layer 13 may be omitted. When grooves are present they have a thickness from about 500 to about 1000 Å. The film, sheet, or layer 13 may act as an adhesive, holding the substrate 11 to the encapsulants. The film 13 has a thickness of from about 30 to about 200 microns and preferably from about 50 to about 100 microns.

Deposited atop the polymerized sheet 13 is a dielectric barrier layer 21. The dielectric barrier layer 21 (e.g., of germanium oxide) is from about 500 to about 2000 Å thick. Preferably it has a thickness of 1030 Å and an optical thickness of (one-quarter of the laser wavelength) times (the index of refraction of the material forming the dielectric layer 21). The dielectric barrier layer 21 has one or more functions. It serves to prevent oxidizing agents from contaminating the chalcogenide semiconductor optical memory material layer 31 and prevents the plastic substrate from deforming due to local heating of the chalcogenide layer 31, during writing and overwriting. The barrier layer 21 also serves as an anti-reflective coating, increasing the optical sensitivity of the chalcogenide memory layer 31. Other dielectrics may provide the encapsulating layers 21 and 41. For example, the encapsulating layers may be silicon nitride, layered or graded to avoid diffusion of silicon into the chalcogenide layer 31. Alternatively, the encapsulating dielectric layers 21, 41 may be silica, alumina, silicon nitride, or another dielectric.

The chalcogenide semiconductor material layer 31, preferably, has an optical thickness of (one half of the laser wavelength) times (the index of refraction of the data storage material, i.e., about 800 Å). Atop layer 31 and in contact with the opposite surface of layer 31 is a second dielectric layer 41, (e.g., a germanium oxide layer). The second dielectric layer 41 may be of equal thickness as the first layer 21. Preferably it has a thickness of (one half of the laser wavelength) times (the index of refraction). A second polymer layer 49 and a second substrate layer 61 may be in contact with the opposite surface of the encapsulating layer 41, alternatively an air sandwich structure may be utilized.

The polyacrylate layers 13, 49, when present, are cast or molded in place. The layers 13, 49 can be photopolymerized in place, (e.g., by the application of ultraviolet light). The barrier layers 21, 41, are deposited, by evaporation (e.g., of germanium and germanium oxide materials) or by sputtering, including reactive sputtering where the content of the reactive gas used is controlled. The chalcogenide thin-film 31 may be prepared by evaporation, sputtering, or chemical vapor deposition.

Figure 13A:
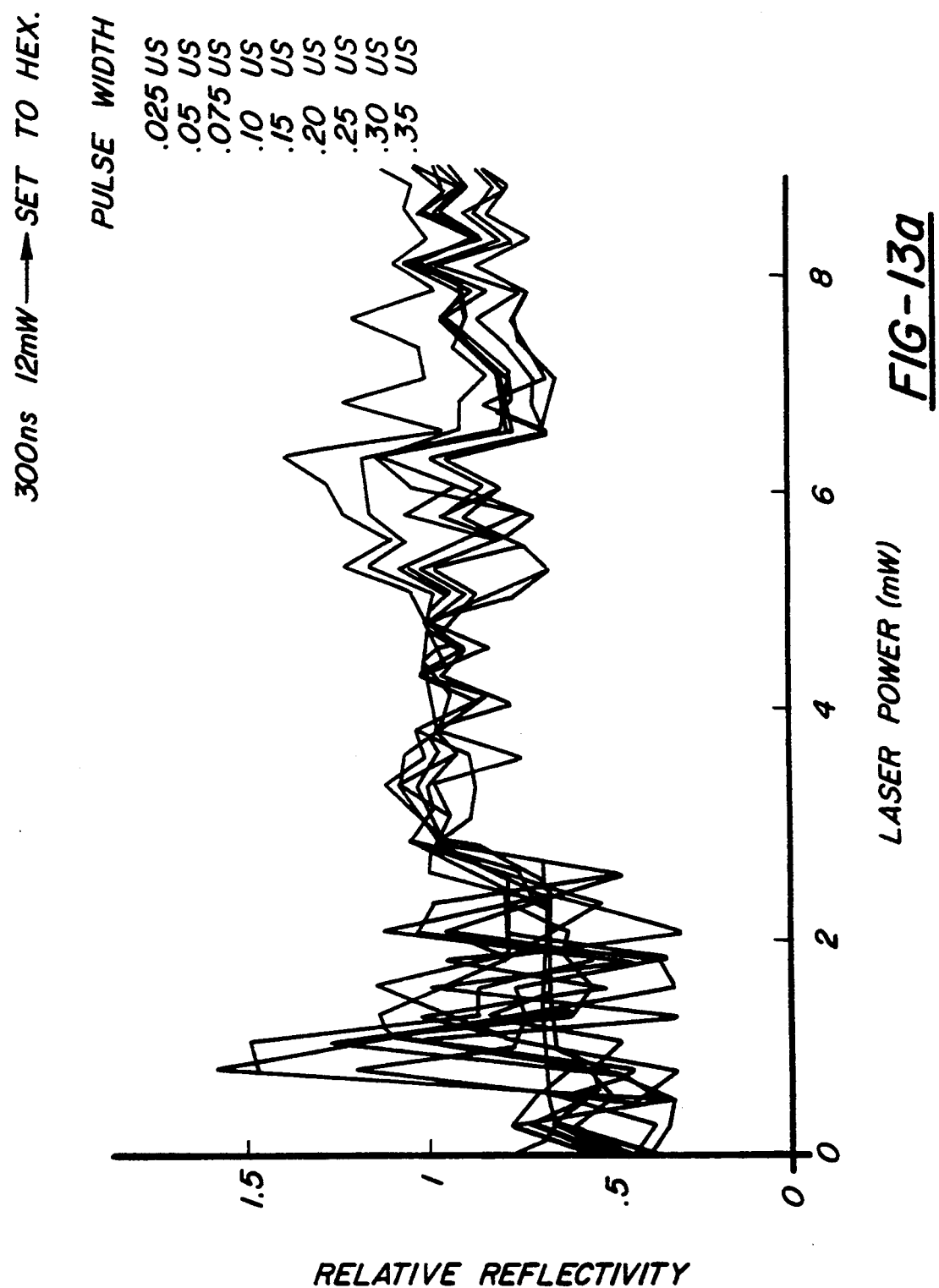
FIG. 13a is a graphical representation in which "relative optical reflectance" (as defined hereinbelow) of an optical memory disk incorporating the novel memory material of the present invention, in a first crystalline state is plotted on the ordinate and laser power (0.25 to 9 mW) for modulating the memory material to a second crystalline state using various pulse widths between 25 and 350 nanoseconds is plotted on the abscissa.

Turning now to FIG. 13a, there is depicted a graphical representation of the "relative optical reflectance" of an optical memory disk incorporating the novel memory material of the present invention, in the hexagonal crystalline state, versus laser power (between 0.25 and 9 mW) used in an attempt to modulate to the face centered cubic crystalline state using various pulse widths between 25 and 350 nanoseconds. "Relative optical reflectance" is defined as the optical reflectance of the material after the attempted modulation, using a laser pulse of selected power and duration, divided by the starting reflectance modulated to the hexagonal crystalline state reflectance by a laser pulse at 12 mW for 300 nanoseconds.

Figure 13B:
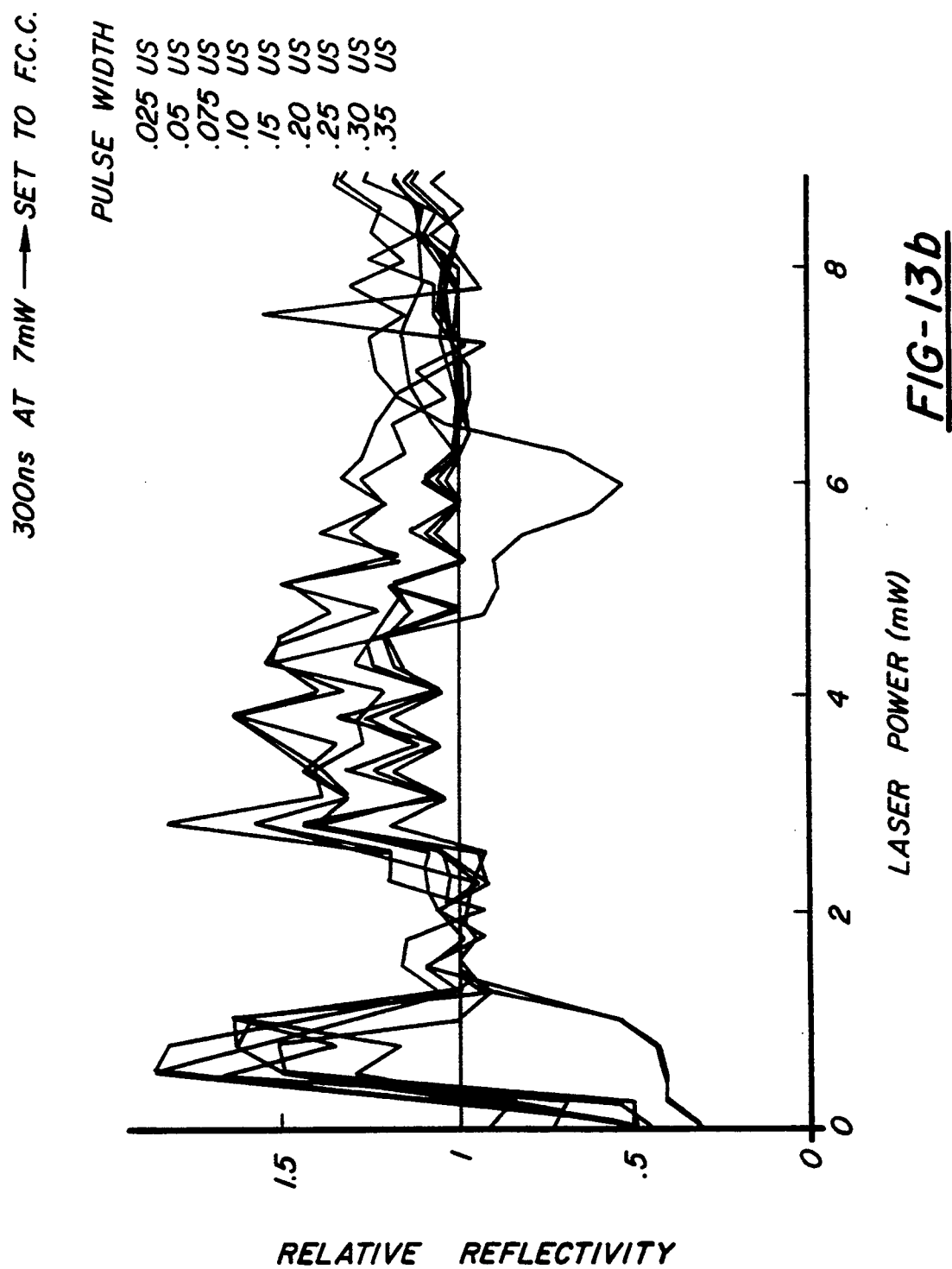
FIG. 13b is a graphical representation in which relative optical reflectance of an optical memory disk incorporating the novel memory material of the present invention, in a second crystalline state is plotted on the ordinate and laser power (0.25 to 9 mW) for modulating the memory material to a first crystalline state using various pulse widths between 25 and 350 nanoseconds is plotted on the abscissa.

FIG. 13b is a graphical representation of the "relative optical reflectance" of an optical memory disk incorporating the novel memory material of the present invention, in the face centered cubic crystalline state, versus laser power (between 0.25 and 9 mW) used in an attempt to modulate to the hexagonal crystalline state using various pulse widths between 25 and 350 nanoseconds. For purposes of this figure, "relative optical reflectance" is defined as the optical reflectance of the material after the attempted modulation, using a laser pulse of selected power and duration, divided by the starting reflectance which was modulated to the face centered cubic crystalline state reflectance by a laser pulse at 7 mW for 300 nanoseconds.

The procedures for obtaining the experimental data for these graphs follows hereinafter. First, a point on the disk was modulated to the desired starting crystalline state (i.e. hexagonal or F.C.C). This was accomplished by irradiating the point with a laser pulse of 12 mW or 7 mW for 300 nanoseconds to set the memory material to either hexagonal or F.C.C phase, respectively. Then the reflectance of the point was measured. Next the point was irradiated by another laser pulse of selected power (between 0.25 and 9.0 mW) and duration (between 25 and 350 nanoseconds) in an attempt to overwrite the point (i.e. convert hexagonal to F.C.C. or F.C.C. to hexagonal phase). Thereafter, the new reflectance of the point was measured. Finally, the ratio of the new reflectance to the original reflectance is calculated and plotted on the ordinate relative to the range of powers and durations which are plotted on the abscissa.

Regarding FIG. 13a, the attempted modulation is successful if the relative reflectance is less than unity. This is because the reflectance of the F.C.C. phase is lower than that of the hexagonal phase. Although the data is somewhat noisy, it can be seen that for laser powers below about 3 mW the modulation (i.e. conversion from the hexagonal to the F.C.C. phase) was successful. With respect to FIG. 13b, the modulation is successful if the relative reflectance is greater than unity. This is because the reflectance of the hexagonal phase is substantially greater than that of the F.C.C. phase. Although this data is also noisy, it can bee seen that for laser powers between about 3 mW and about 8 mW the modulation (i.e. conversion from the F.C.C. to hexagonal phase) was successful.

These results are significant in that, they show it is possible to use crystalline-to-crystalline phase transformations to optically store data. Of course, it bears repeating that by using the crystalline-to-crystalline switching regime, the required switching power is significantly reduced as compared with the amorphous-to-crystalline regime of the prior art. This reduction in switching power thereby increases the cycle life of the optical disk because the switching transition to the amorphous lattice created "hotspots" on the memory film which caused distortion and in some instances melted the plastic encapsulant coating at these points. Therefore, the lower power regime of the instant invention, by reducing or eliminating these "hotspots", increases the cycle life of the optical disks immensely. Experimental data taken on optical disks incorporating the memory material of the instant invention have shown a reflectance of about 70% (corresponding to a primarily hexagonal crystalline structure) for optical input signals of 5-10 milliwatts and 25-300 nanoseconds and a reflectance of about 50% (corresponding to a primarily F.C.C. crystalline structure) for optical input signals of 5-10 milliwatts for 25-100 nanoseconds.

Figure 14A:
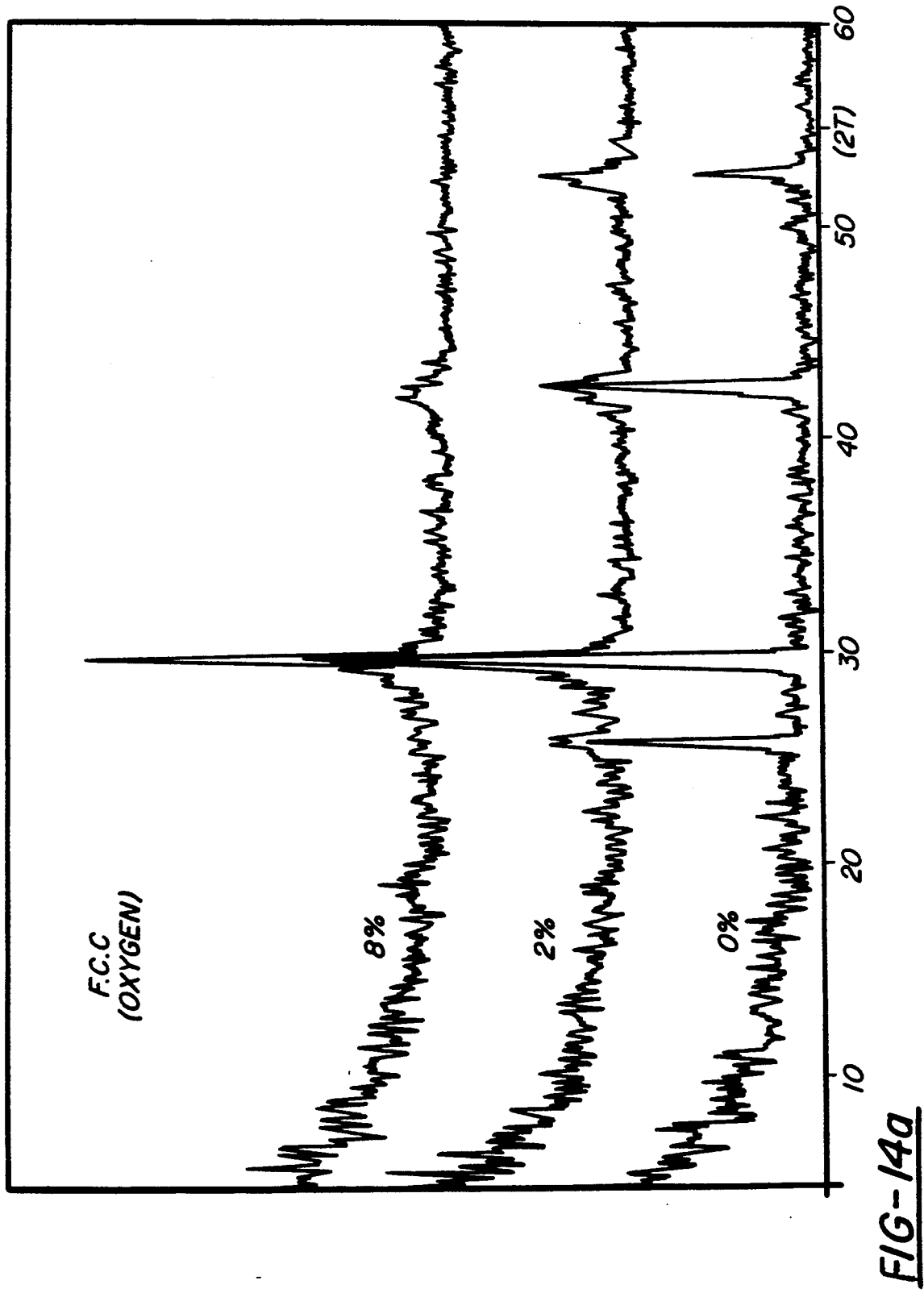
FIG. 14a and 14b are graphical representations of X-ray diffraction analyses of evaporated and sputtered tellurium-germanium-antimony films annealed at 200° and 400° C., respectively; the lowermost diffraction trace representing an evaporated film which contains 0% oxygen and the middle and upper diffraction traces representing sputtered films containing 2% and 8% oxygen, respectively.
Figure 14B:
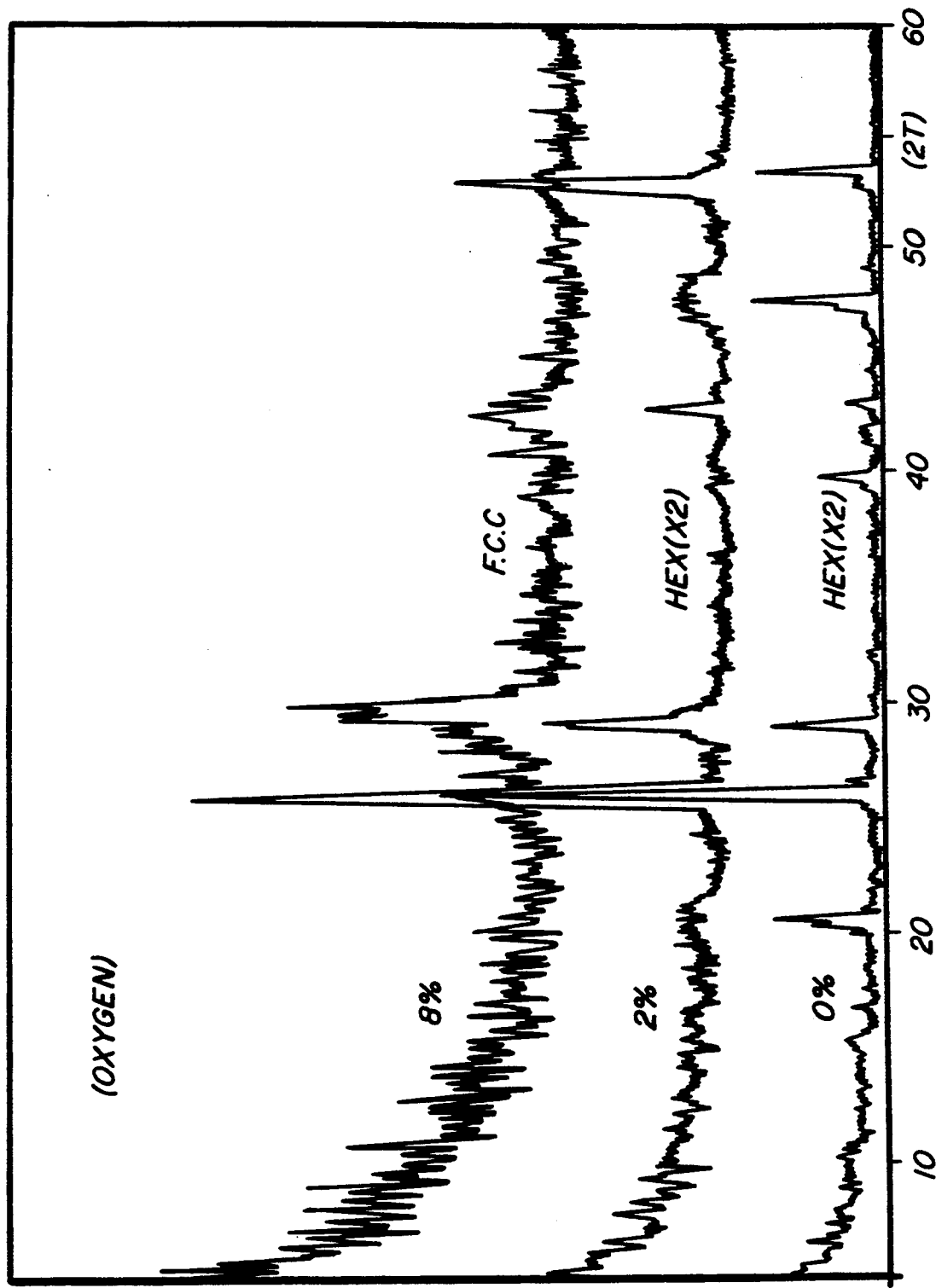

FIG. 14a and 14b are graphical plots of X-ray diffraction data generated on evaporated and sputtered tellurium-germanium-antimony films annealed at 200° and 400° C., respectively. The lowermost diffraction pattern is for an evaporated film which contains 0 atomic % (undetectable amount, i.e., <0.1 atomic %) oxygen. The middle and upper diffraction patterns are for sputtered films containing 2 atomic and 8 atomic % oxygen, respectively.

Regarding FIG. 14a, it can be seen from the presence of the peaks at about 29.5 degrees two theta, indicating the presence of crystalline material, and the virtual absence of a peak indicating the presence amorphous material, that the films as annealed at 200° C. are in the F.C.C. crystalline phase. By analyzing the width of the peaks at 29.5 degrees two theta, it was determined that the average crystallite sizes were about 709, 92 and 66 Å for the films containing 0%, 2% and 8% oxygen, respectively.

With respect to FIG. 14b, it can be seen by the peaks at about 25.7 degrees two theta that the 0% and 2% oxygen containing films, when annealed at 400° C., are transformed to the hexagonal phase. However, the 8% oxygen containing film is not transformed to the hexagonal state at this temperature. The average crystallite sizes, for the films annealed at 400° C., are 1538, 582 and 78 Å for the films containing 0%, 2% and 8%1 % oxygen respectively.

Therefore, it can be seen that the oxygen content of the film either controls, or plays a significant role in controlling, the crystallite size. As mentioned above, the crystallite size generally, and the relative ratio of the number of atoms within the bulk of the crystallite relative to the number of atoms surrounding that crystallite is believed, in turn to control the Fermi level position (and therefore the extrinsic electrical conductivity) of the semiconductor material. Additionally, oxygen may represent an impurity atom which provides the chalcogenide composition with an increased number of defect states for intrinsically altering the electrical conductivity of thereof. This electrical behavior has been shown to be significantly different than the behavior of all other previously known chalcogenide memory materials.

Through the use of the proprietary materials and device configurations disclosed herein, an electrically erasable, directly overwritable memory element of the present invention provides fast read and write speeds which approach that of SRAM devices; non-volatility and random access reprogramming capabilities of an EEPROM; and a price per megabyte of storage that approaches that of hard disk memory.

It cannot be sufficiently stressed that it is possible that the ramifications of the free charge concentration modulation capabilities of the materials of the present invention have the greatest economic impact in the field of semiconductor devices. As detailed in the background section above, the type of charge carrier modulation disclosed herein represents a fifth type of charge carder modulation, and one that represents a fundamental departure from the prior art. Simply stated, in the materials of the present invention, even after removal of the field, the Fermi level position, the electrical conductivity, and the concentration of free charge remain fixed. Thus, it becomes possible to build either a new class of semiconductor devices in which either three terminals are employed for modulation and switching to be accomplished in "real time" or two terminals are employed and the device is preprogrammed to preselected values of electrical resistivity. In either event, the programming voltages and/or energies are remarkably low and the reaction speeds are remarkably fast. This is because the semiconductor materials of the present invention have inherent speed and energy capabilities resulting from modulation that occurs within one or more different crystalline phases.

For purposes of the instant invention, note that the term "homogeneous" will refer to not only the substantial mount of compositional homogeneity of the chalcogenide materials, but also the lack of special doping elements present within the host matrix thereof which are necessarily present in silicon or other chalcogenide memories in order to establish current conduction paths or other induction channels.

The electrically erasable phase change memory of the present invention provides remarkable improvements in performance over that attainable with prior art electrically erasable phase change memories. This permits the widespread application of such memories beyond that possible with prior an memories. It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An optical memory disk of directly overwritable, multilevel, single-cell memory elements comprising:
   a substrate;
   a large area body of memory material capable of forming a plurality of optically operated, directly overwritable, multilevel, single-cell memory elements on said substrate;
   each of said memory elements formed by a small area portion of said large area body of memory material, each of said small area portions defining a single memory cell;
   said memory material constituting means for assuming a large dynamic range of optical reflectance values with the ability to be set directly to one of a plurality of reflectance values within said dynamic range without the need to be set to a specific starting or erased reflectance value, regardless of the previous reflectance value of said material in response to a selected optical input signal so as to provide each of said single cells with multilevel storage capabilities; and
   means for the selective addressing, setting and reading of said reflectance values of each individual memory element.

2. The optical memory disk of claim 1 wherein said memory material is formed of a composition including at least one chalcogenide element.

3. The optical memory disk of claim 2 wherein said composition includes at least one chalcogenide element is homogenous.

4. The optical memory disk of claim 1 wherein said dynamic range of detectable resistance or reflectance values provides for at least 3 distinct detectable levels of optical reflectance values.

5. The optical memory disk of claim 1 wherein said dynamic range and said multilevel capabilities provides storage for at least 1 and ½ bits of binary information in a single cell memory element.

6. The optical memory disk of claim 1 wherein said memory material is selected from the group consisting of Se, Te, Ge, Sb, Bi, Pb, Sn, As, S, Si, P, O and mixtures or alloys thereof.

7. The optical memory disk of claim 6 wherein said memory material includes Te, Ge and Sb in the ratio $Te_aGe_bSb_{100-(a+b)}$ where the subscripts are in atomic percentages which total 100% of the constituent elements and $a \leq 70$ and $5 \leq b \leq 50$.

8. The optical memory disk of claim 7 where $48 \leq a \leq 58$ and $8 \leq b \leq 40$.

9. The optical memory disk of claim 1 wherein said selected optical input signal which sets said memory material to any reflectance value within said dynamic range is at least one signal pulse of a selected energy.

10. The optical memory disk of claim 1 wherein said memory material can be set to a desired reflectance value within said dynamic range by a selected optical input signal duration of less than about 250 nanoseconds.

11. The optical memory disk of claim 9 wherein said selected optical input signal is a plurality of energy pulses and a feedback loop is provided for initiating additional energy pulses to insure that each cell is set at the desired reflectance value.

12. The optical memory disk of claim 11 wherein the total duration of said plurality of energy pulses in said feedback loop is less than about 500 nanoseconds.

13. The optical memory disk of claim 1 wherein said cell of memory material is settable at a reflectance value of about 70% for a signal power of about 5–10 milliwatts and a signal duration of about 25–350 nanoseconds.

14. The optical memory disk of claim 1 wherein said cell of memory material is settable at a reflectance value of about 50% for a signal power of about 5–10 milliwatts and a signal duration of about 25–100 nanoseconds.

15. The optical memory disk of claim 1 wherein the thickness of the volume of memory material of each cell is from about 100 Å to about 5000 Å.

16. The optical memory disk of claim 1 further comprising a layer of encapsulating material extending over and sealing said large area body of memory material against environmental influences.

17. An optical memory disk of directly overwritable, single-cell memory material comprising:
   a substrate;
   a large area body of memory material capable of defining a plurality of optically operated, directly overwritable single-cell memory elements on said substrate;
   each of said single-cell memory elements defined by a small area portion of said large area body of memory material;
   said memory material having an optically modulatable crystal lattice structure which provides means for assuming two different optical reflectance values corresponding to two different crystal lattice structures; and the ability to be set directly to either one of said two reflectance values without the need to be set to a specific starting or erased reflectance values, regardless of the previous reflectance value of said material in response to a selected optical input signal; and means for the selective addressing, setting and reading of said reflectance values of each individual memory element.

18. The optical memory disk of claim 17 further comprising a layer of encapsulating material extending over and sealing said large area body of memory material against environmental influences.

19. The optical memory disk of claim 18 wherein the low energy requirements for transitions within a crystalline state provides for substantially increased cycle life of said optical memory disk as compared to amorphous-to-crystalline transition optical memory disks by reducing the cycling temperature required.

20. The optical memory disk of claim 17 wherein said memory material is formed of a composition including at least one chalcogenide element.

21. The optical memory disk of claim 20 wherein said composition includes at least one chalcogenide element is homogenous.

22. The optical memory disk of claim 17 wherein said memory material is selected from the group consisting of So, Te, Ge, Sb, Bi, Pb, Sn, As, S, Si, P, O and mixtures or alloys thereof.

23. The optical memory disk of claim 22 wherein said memory material includes Te, Ge and Sb in the ratio $Te_a Ge_b Sb_{100-(a+b)}$ where the subscripts are in atomic percentages which total 100% of the constituent elements and $a \leq 70$ and $5 \leq b \leq 50$.

24. The optical memory disk of claim 23 where $48 \leq a \leq 58$ and $8 \leq b \leq 40$.

25. The optical memory disk of claim 17 wherein said optical input signal which sets said memory material to either of said reflectance values is at least one pulse of a selected energy.

26. The optical memory disk of claim 17 wherein said memory material can be set to either one of said reflectance values by an optical input signal duration of less than about 250 nanoseconds.

27. The optical memory disk of claim 25 wherein said optical input signal is a plurality of energy pulses and a feedback loop is provided for initiating additional energy pulses to insure that each cell is set at the desired reflectance value.

28. The optical memory disk of claim 27 wherein the total duration of said plurality of energy pulses in said feedback loop is less than about 500 nanoseconds.

29. The optical memory disk of claim 17 wherein the thickness of the volume of memory material of each cell is from about 100 Å to about 5000 Å.

* * * * *